(12) United States Patent
Min et al.

(10) Patent No.: US 10,930,656 B2
(45) Date of Patent: Feb. 23, 2021

(54) MEMORY DEVICE

(71) Applicant: Korea Advanced Institute of Science And Technology, Daejeon (KR)

(72) Inventors: Bum Ki Min, Daejeon (KR); Woo Young Kim, Daejeon (KR); Hyeon Don Kim, Daejeon (KR); Teun Teun Kim, Daejeon (KR); Seung Hoon Lee, Daejeon (KR)

(73) Assignee: KOREA ADVANCED INSTITUTE OF SCIENCE AND TECHNOLOGY, Daejeon (KR)

( * ) Notice: Subject to any disclaimer, the term of this patent is extended or adjusted under 35 U.S.C. 154(b) by 40 days.

(21) Appl. No.: 16/086,853

(22) PCT Filed: Dec. 13, 2016

(86) PCT No.: PCT/KR2016/014591
§ 371 (c)(1),
(2) Date: Sep. 20, 2018

(87) PCT Pub. No.: WO2017/164487
PCT Pub. Date: Sep. 28, 2017

(65) Prior Publication Data
US 2019/0051658 A1    Feb. 14, 2019

(30) Foreign Application Priority Data

Mar. 21, 2016 (KR) .................. 10-2016-0033595

(51) Int. Cl.
*H01L 27/11* (2006.01)
*H01L 27/11507* (2017.01)
(Continued)

(52) U.S. Cl.
CPC ...... *H01L 27/11507* (2013.01); *G11C 11/221* (2013.01); *G11C 11/2253* (2013.01); *G11C 11/2255* (2013.01); *G11C 11/2257* (2013.01); *G11C 11/2259* (2013.01); *G11C 11/2275* (2013.01); *G11C 11/5657* (2013.01); *G11C 13/0016* (2013.01); *G11C 13/025* (2013.01); *G11C 13/047* (2013.01); *H01L 28/55* (2013.01);
(Continued)

(58) Field of Classification Search
CPC ..................... H01L 27/11507; G02F 1/133509
See application file for complete search history.

(56) References Cited

U.S. PATENT DOCUMENTS

2011/0316059 A1* 12/2011 Ahn ................. H01L 21/84
257/295
2017/0249983 A1*  8/2017 Park ................. G11C 11/2275

* cited by examiner

*Primary Examiner* — Trang Q Tran
(74) *Attorney, Agent, or Firm* — Foley & Lardner LLP

(57) ABSTRACT

A memory device may be provided that includes: a substrate; a coupling layer which is located on the substrate and has electrical conductivity; a meta-atomic layer which is located on or under the coupling layer; a memory layer which is located on the meta-atomic layer; and an electrode layer which is located on the memory layer and has electrical conductivity. The memory layer is composed of a material which produces spontaneous polarization at a voltage equal to or higher than a predetermined voltage. Through this, the memory device can be electrically driven and can continuously maintain modulated optical characteristics. Also, the memory device according to the embodiment of the present invention can modulate optical characteristics by multiple electrical inputs.

8 Claims, 25 Drawing Sheets

(51) Int. Cl.
*H01L 45/00* (2006.01)
*H01L 49/02* (2006.01)
*G11C 11/22* (2006.01)
*G11C 13/02* (2006.01)
*G11C 11/56* (2006.01)
*G11C 13/04* (2006.01)
*G11C 13/00* (2006.01)

(52) U.S. Cl.
CPC .......... *H01L 45/00* (2013.01); *G11C 2213/35* (2013.01); *G11C 2213/71* (2013.01)

[Figure 1]
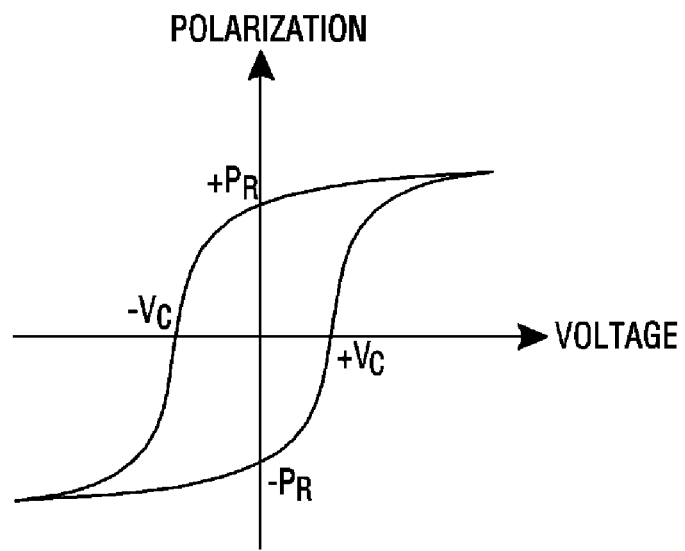
[Figure 2a]
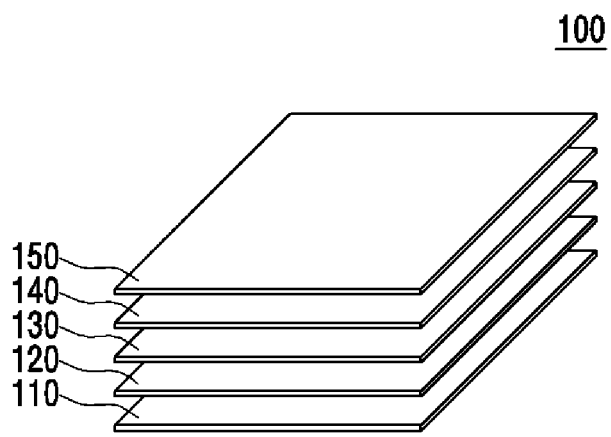

[Figure 2b]
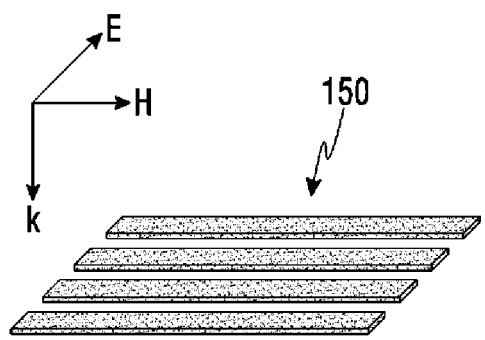
[Figure 2c]
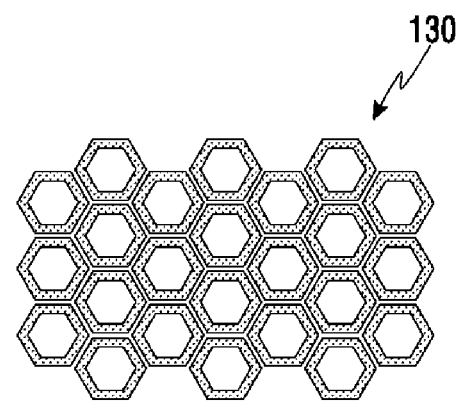
[Figure 2d]
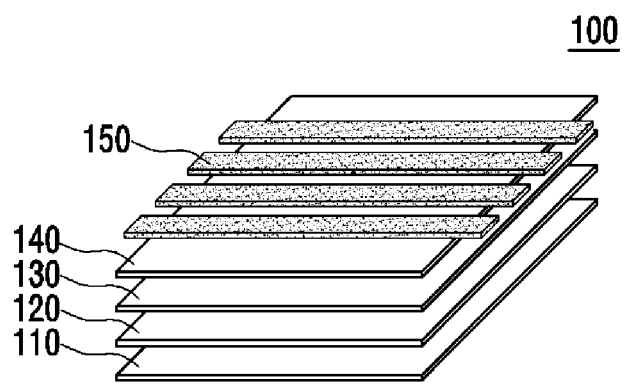

[Figure 3a]
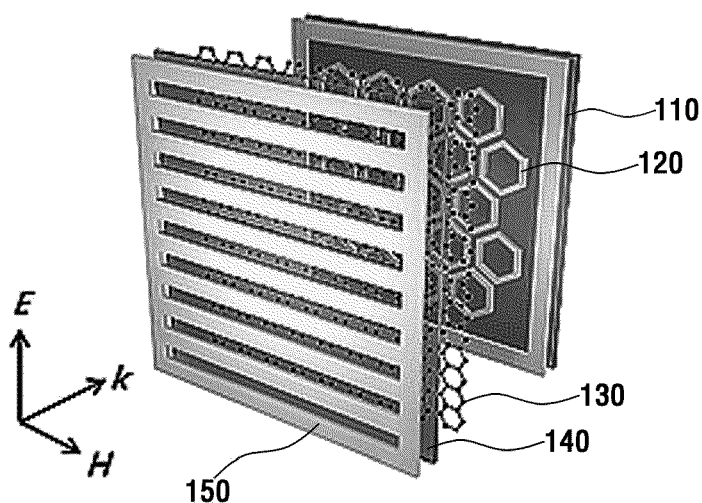
[Figure 3b]
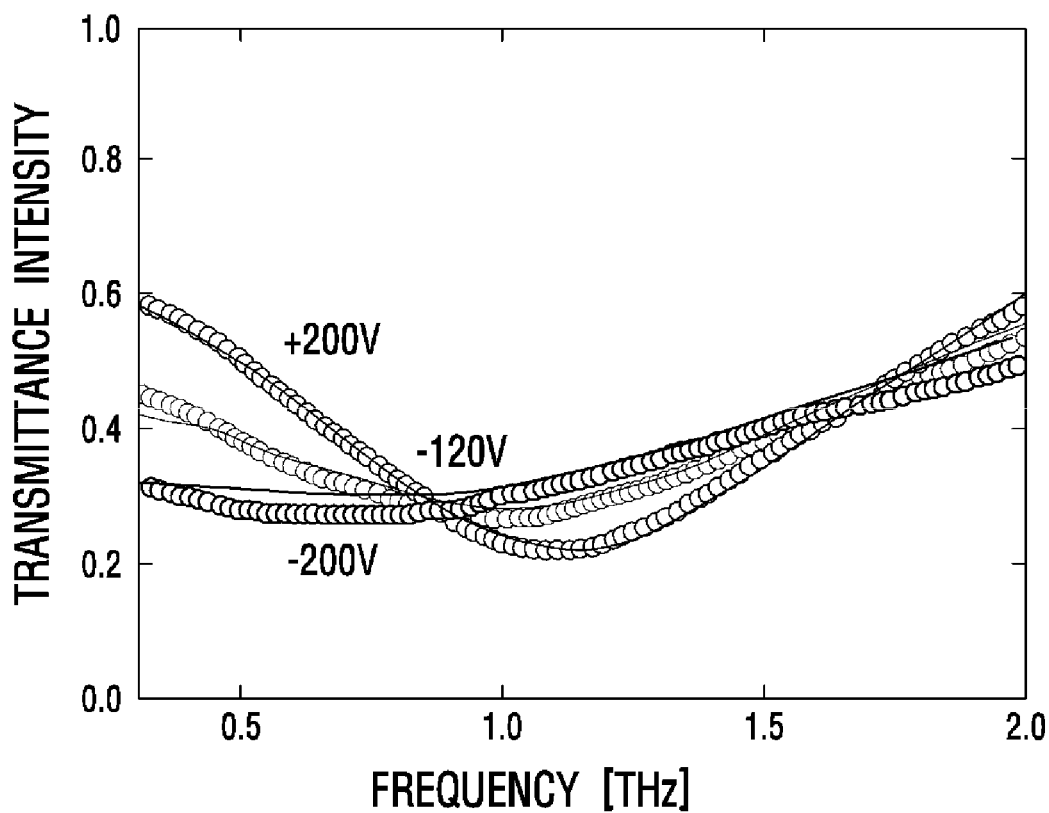

[Figure 3c]
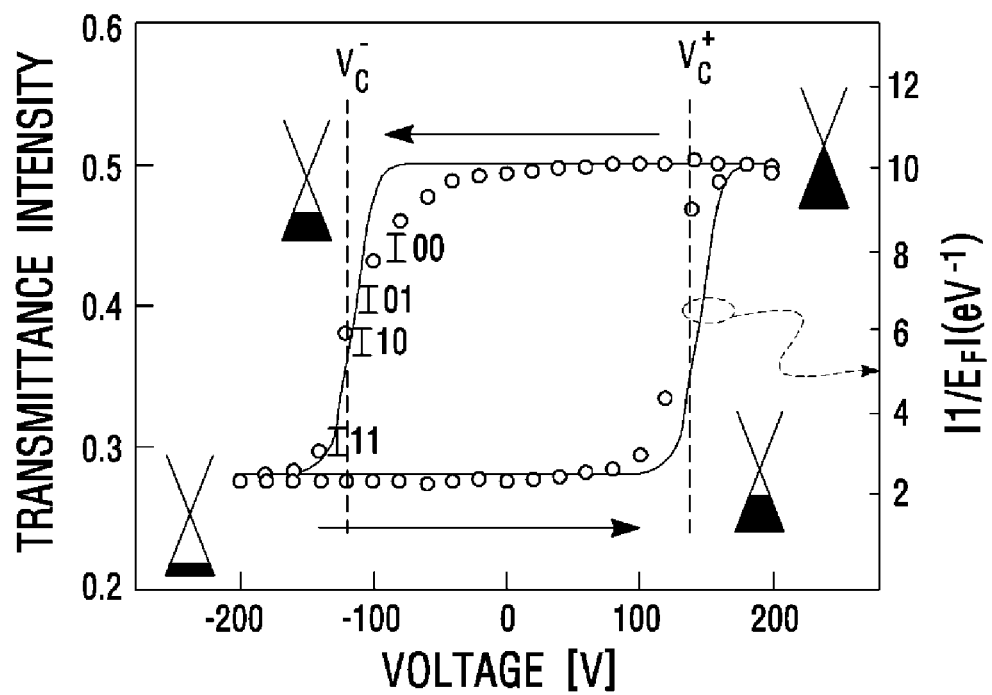

[Figure 3d]
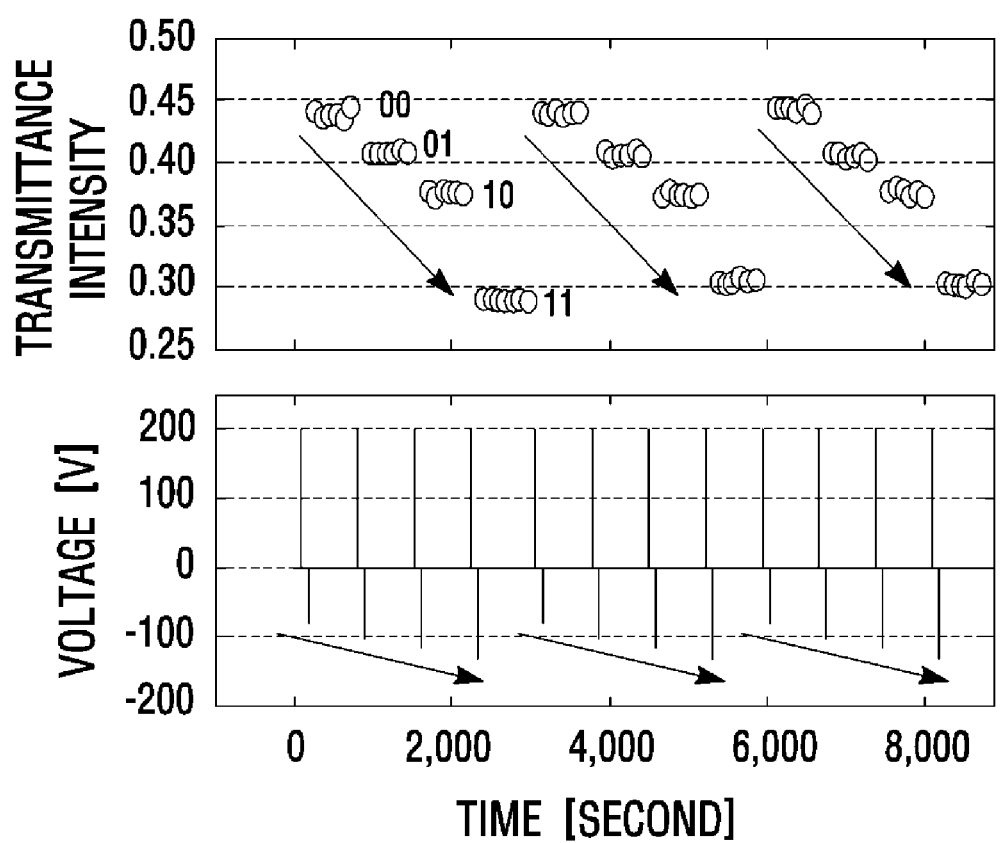

[Figure 3e]
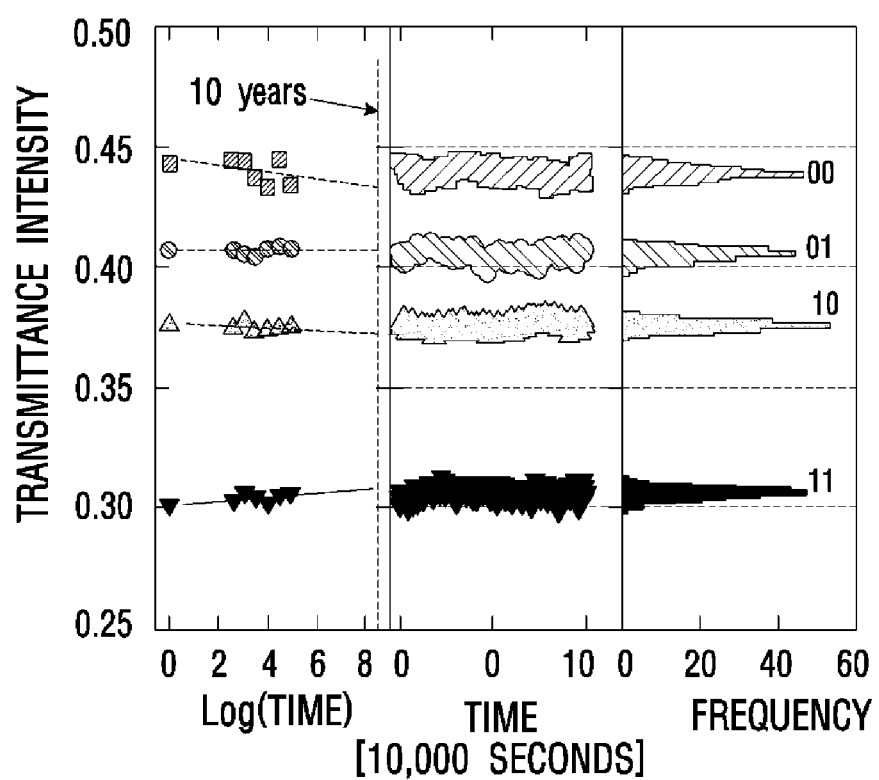

[Figure 4a]
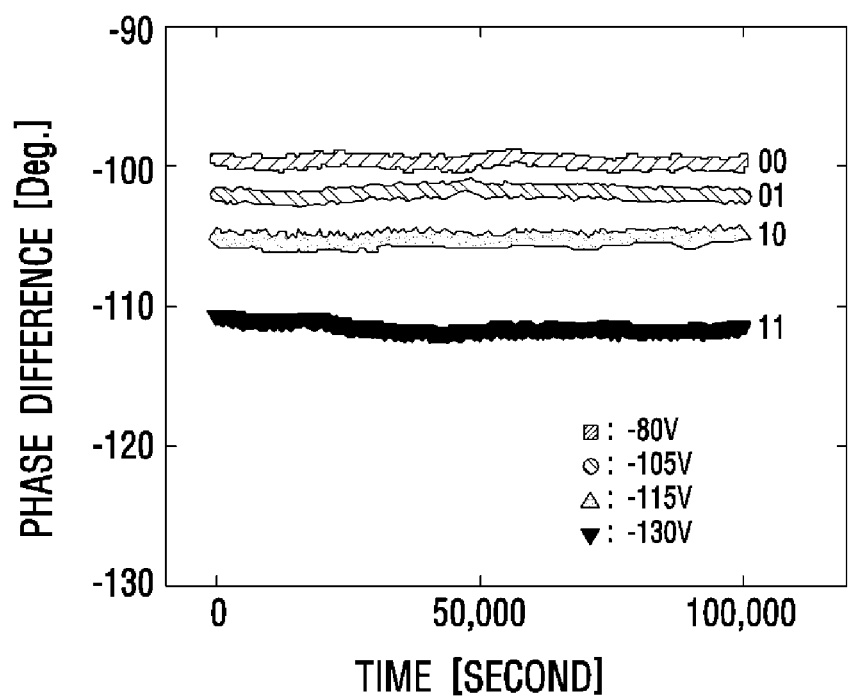

[Figure 4b]
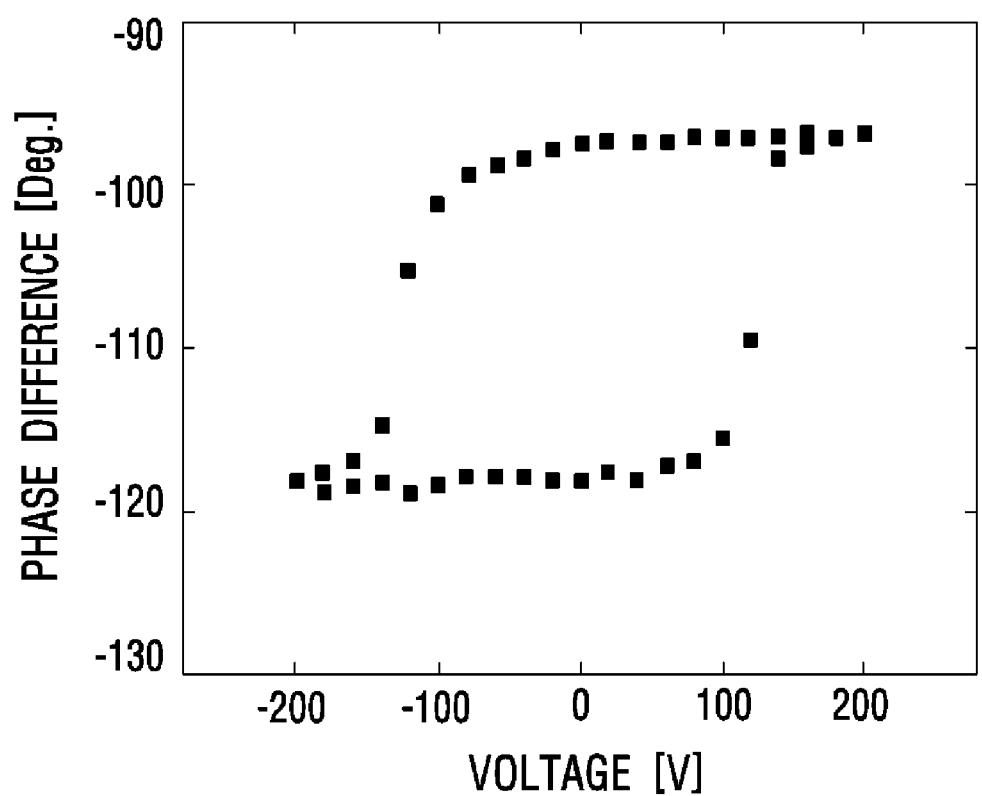

[Figure 5]
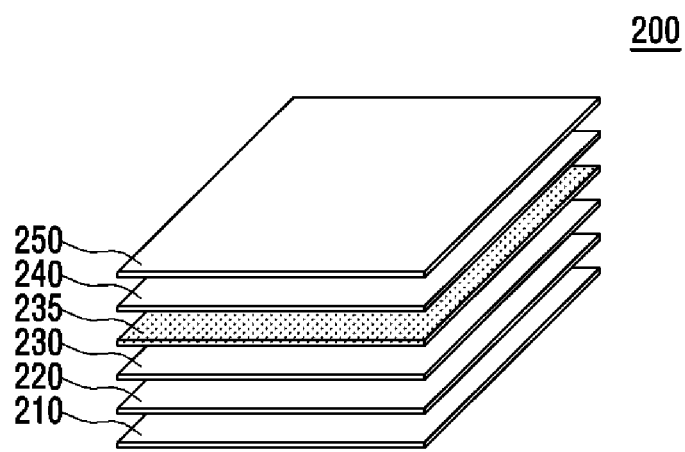
[Figure 6]
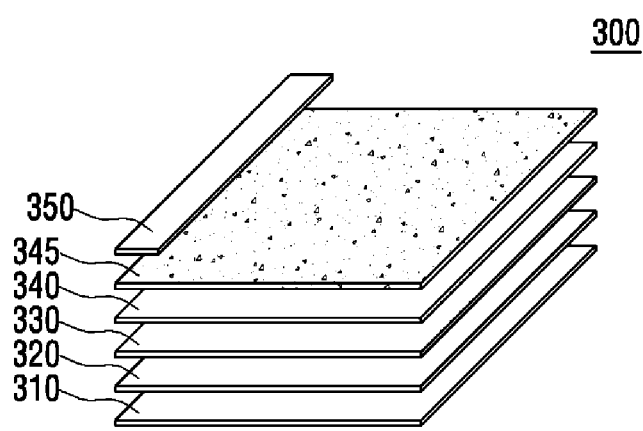

[Figure 7a]
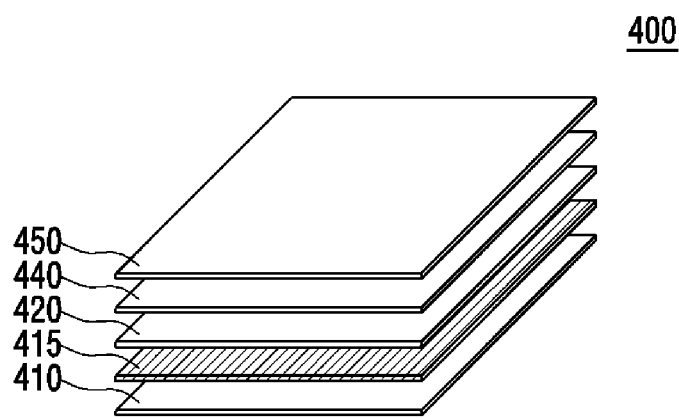
[Figure 7b]
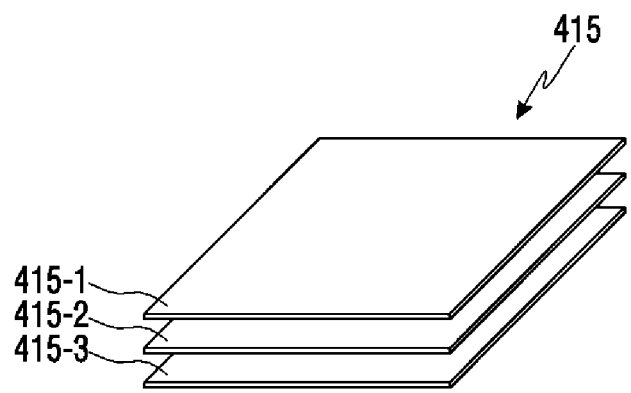

[Figure 7c]
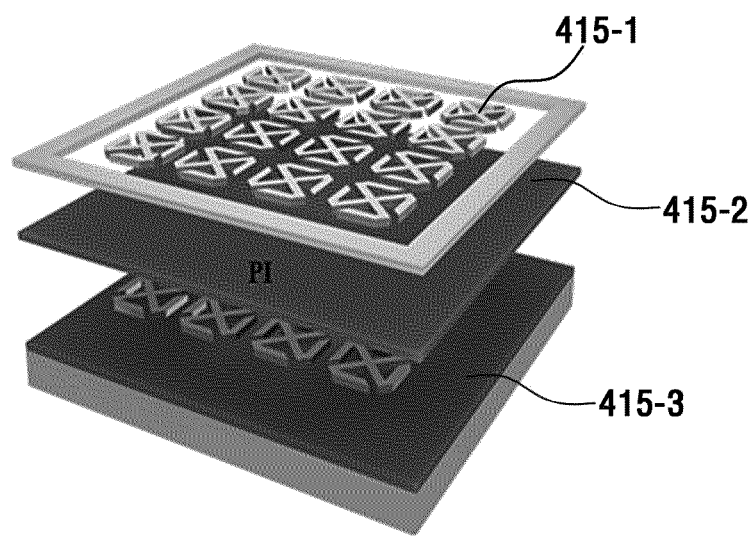
[Figure 7d]
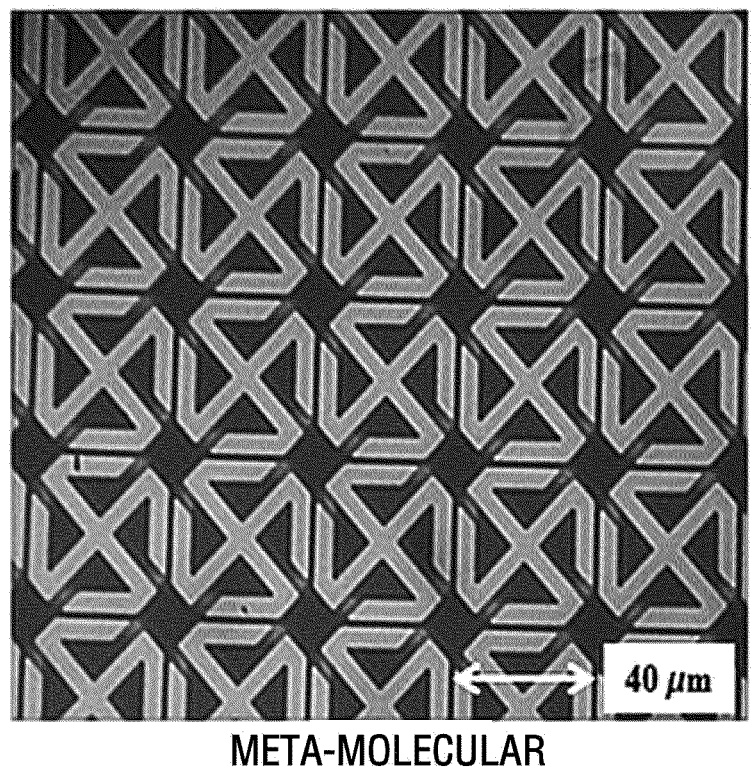
META-MOLECULAR

[Figure 8a]
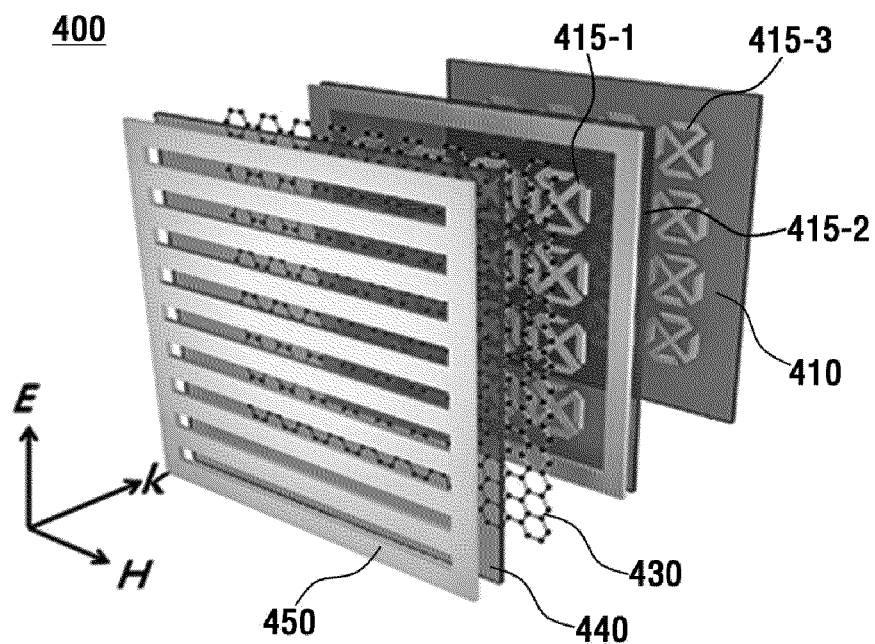

[Figure 8b]
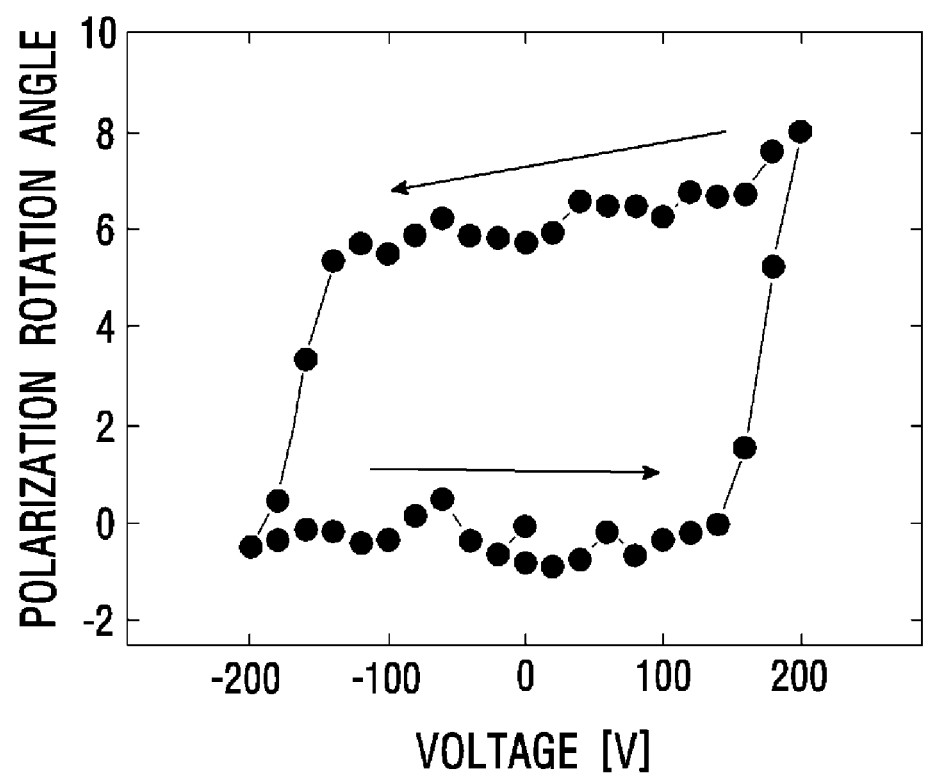

[Figure 8c]
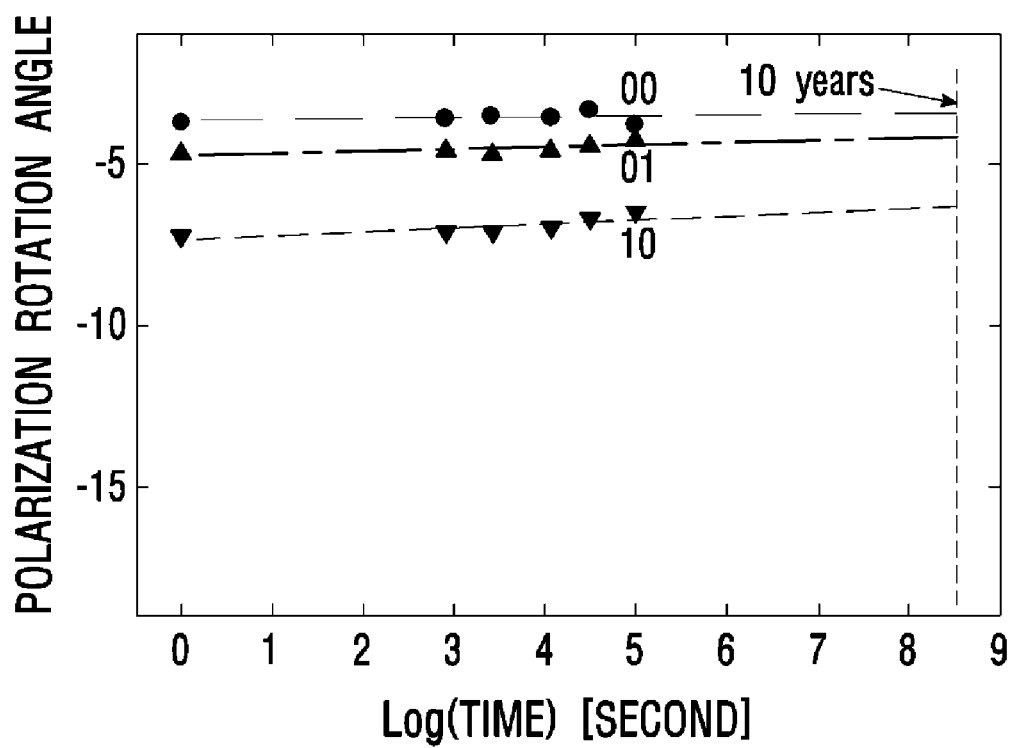

[Figure 8d]
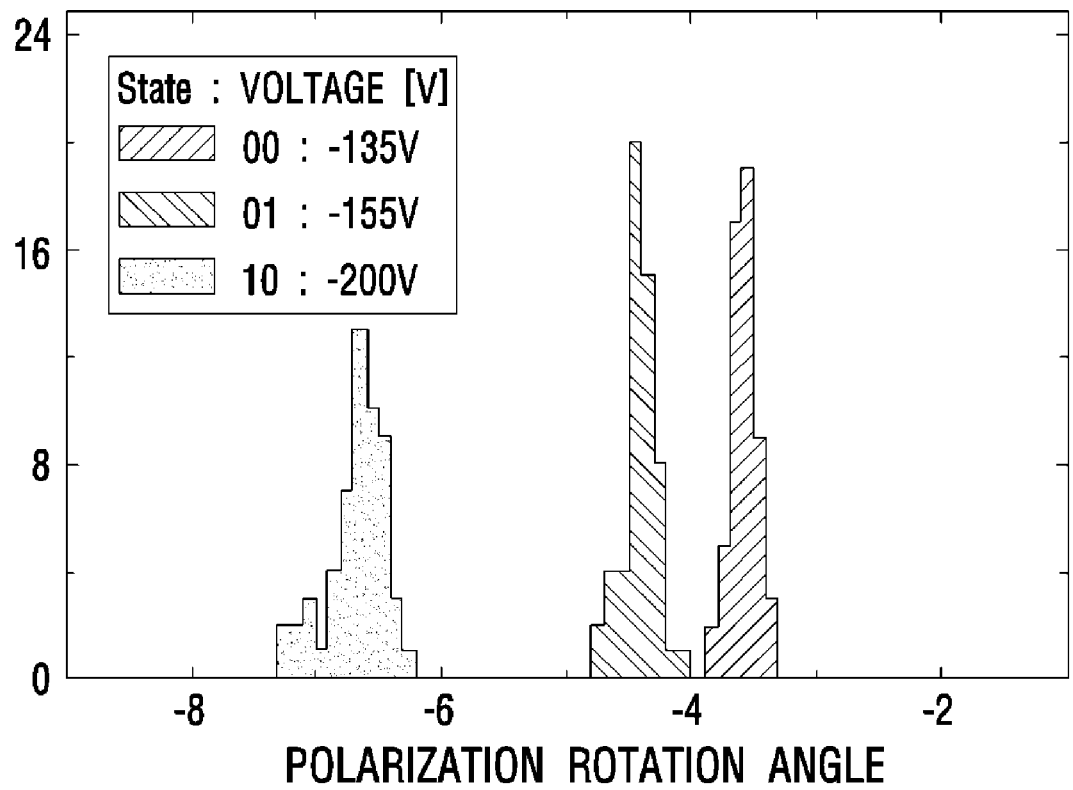
[Figure 9a]
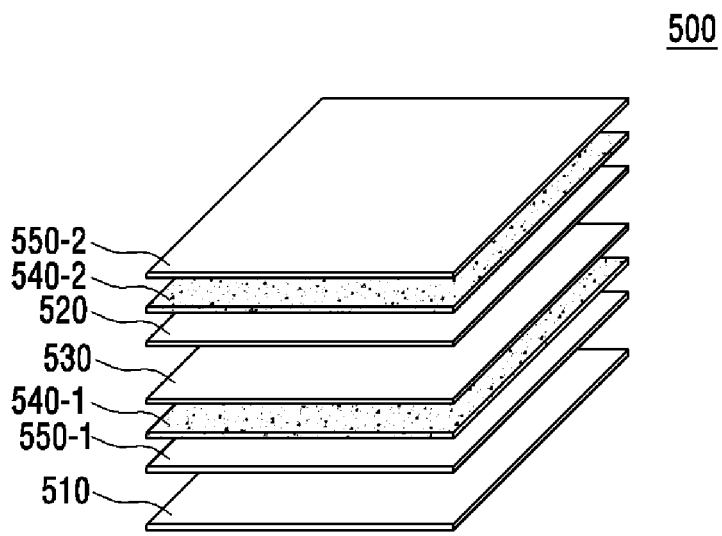

[Figure 9b]
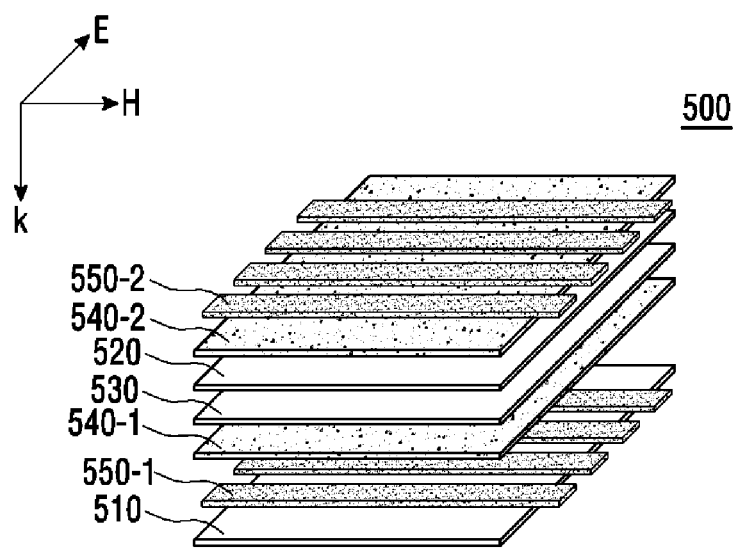
[Figure 9c]
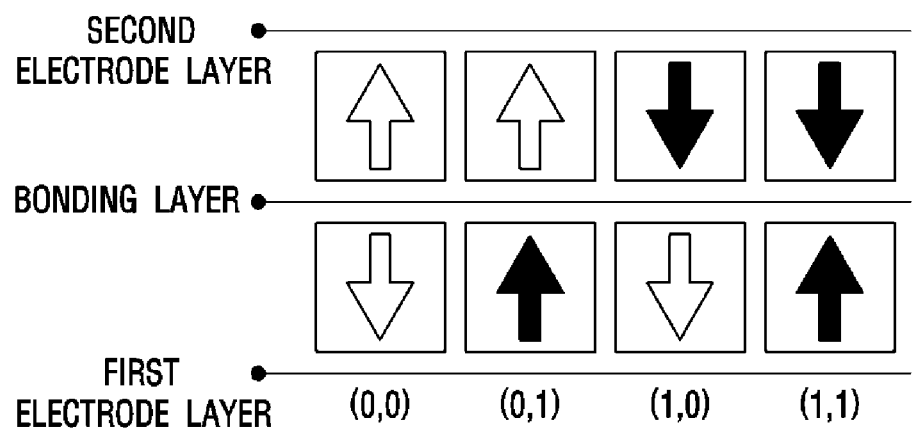

[Figure 9d]
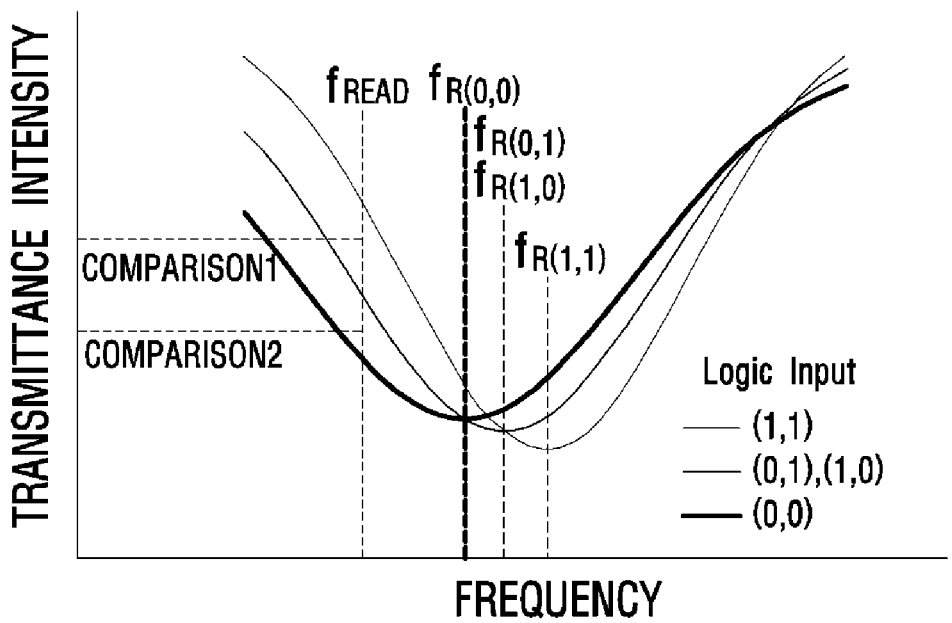
[Figure 10a]
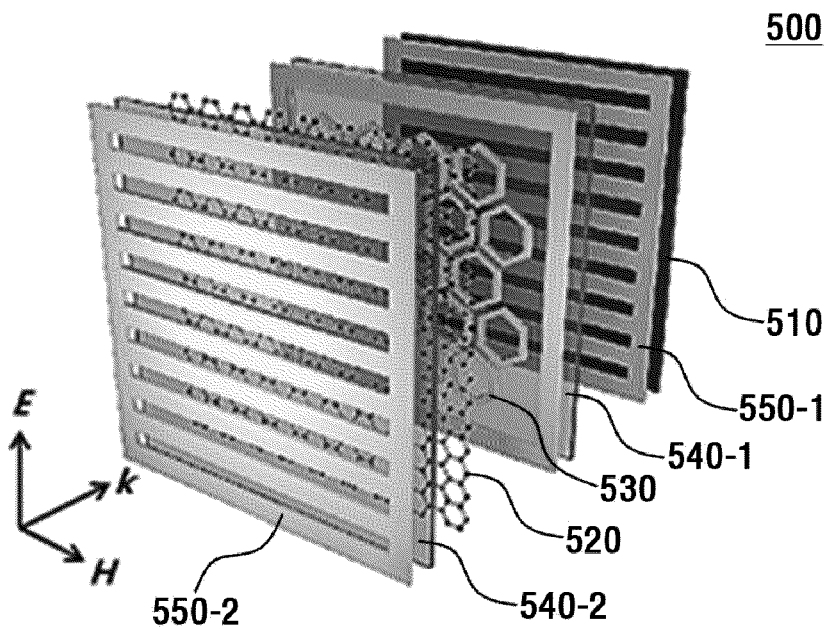

[Figure 10b]
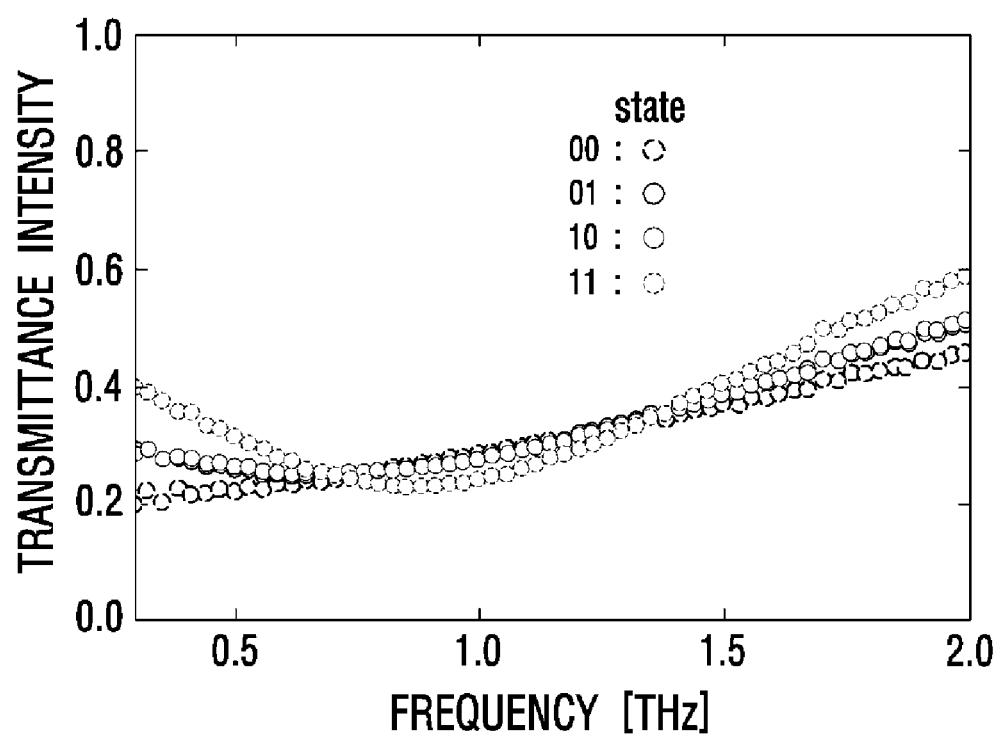
[Figure 11a]
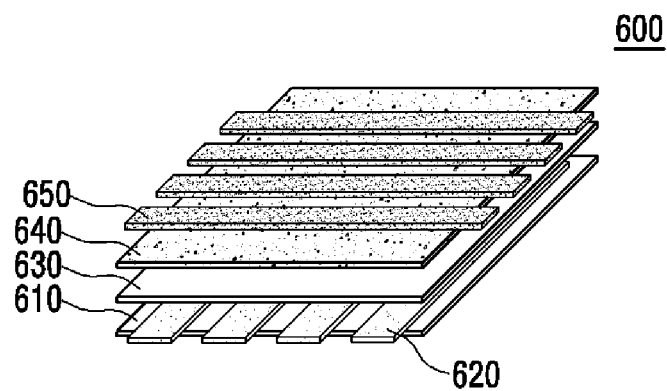

[Figure 11b]
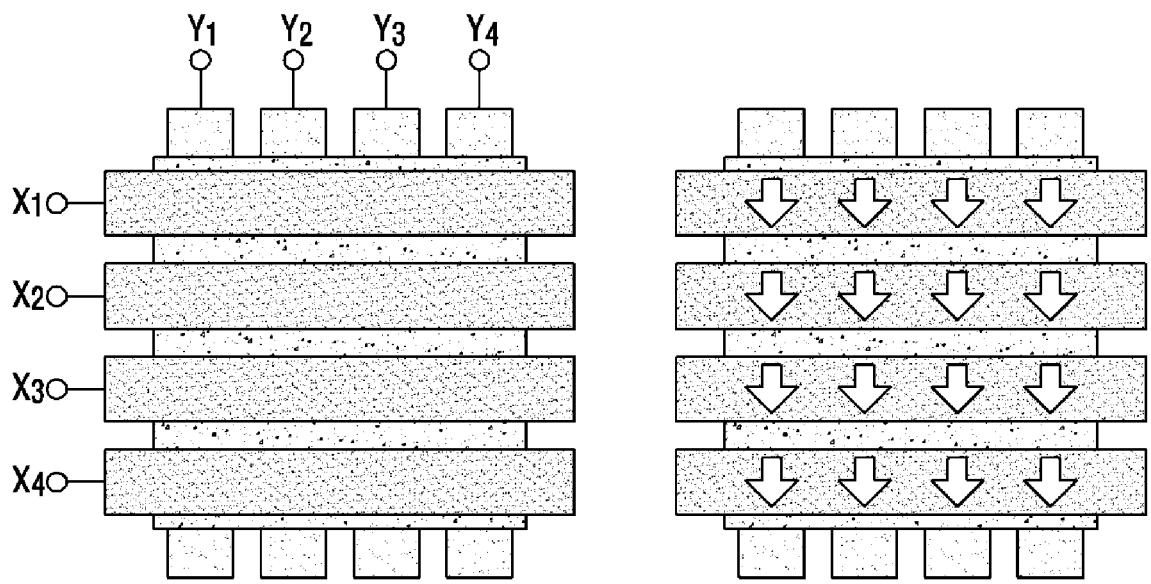
[Figure 11c]
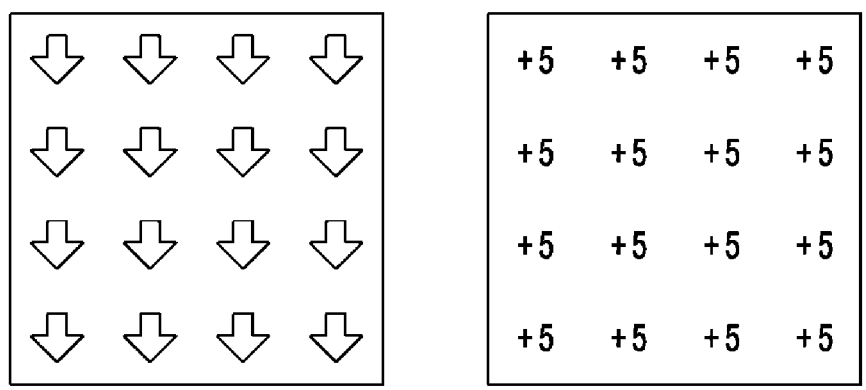

[Figure 11d]
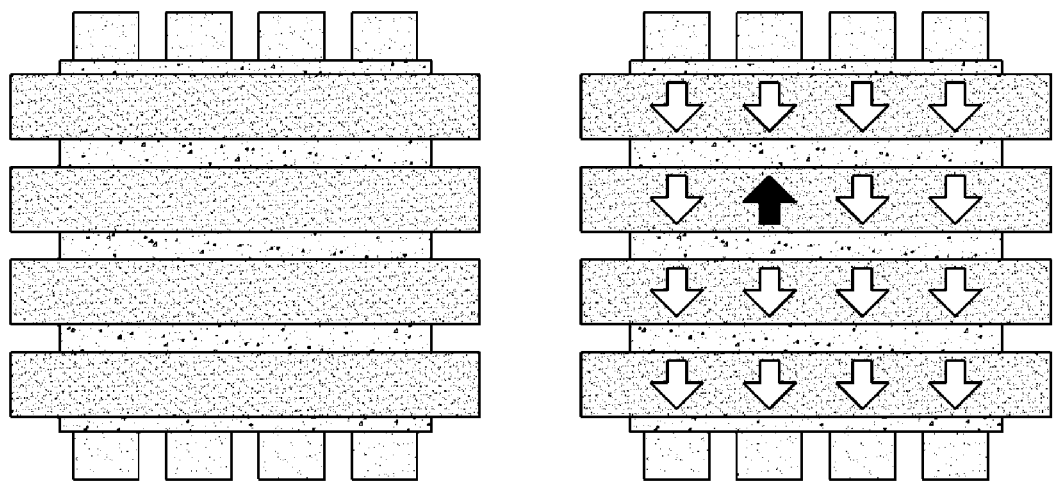
[Figure 11e]
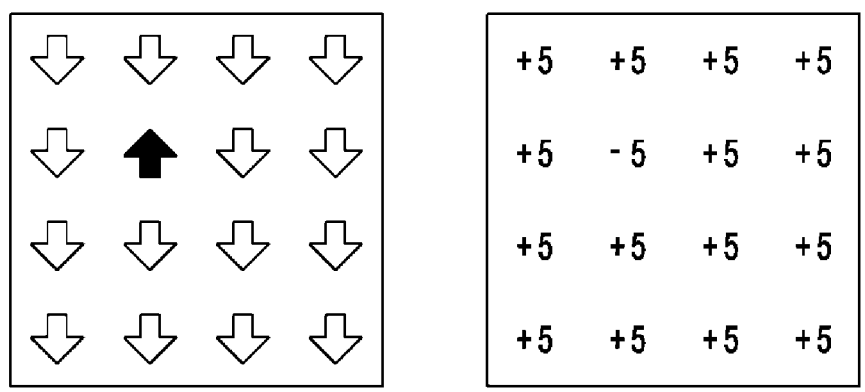

[Figure 12a]
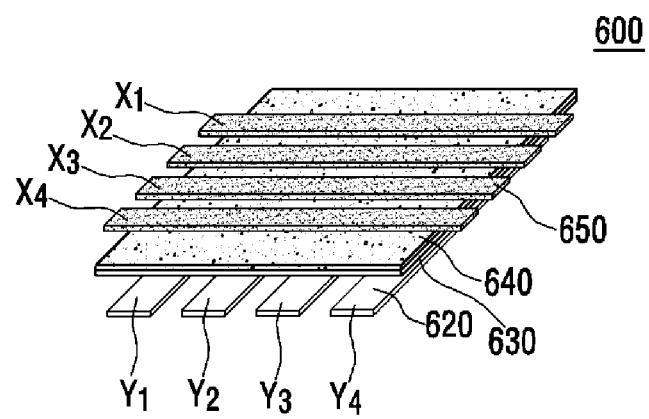
[Figure 12b]
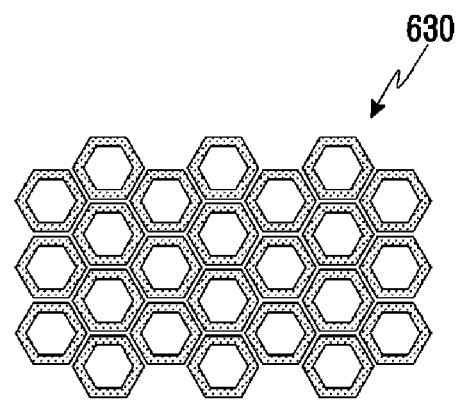

[Figure 12c]
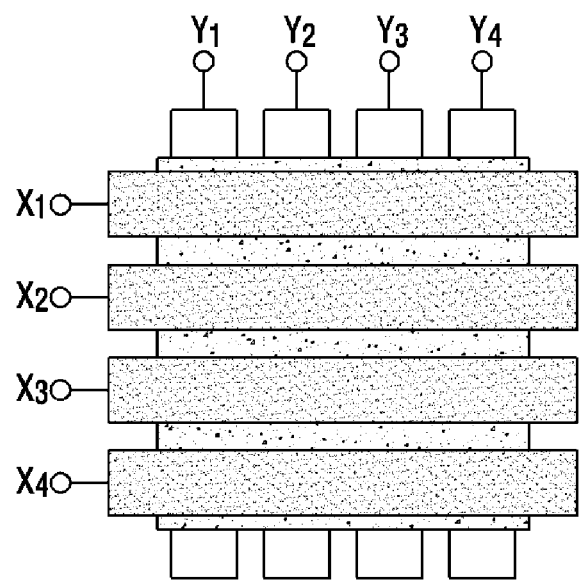
[Figure 12d]
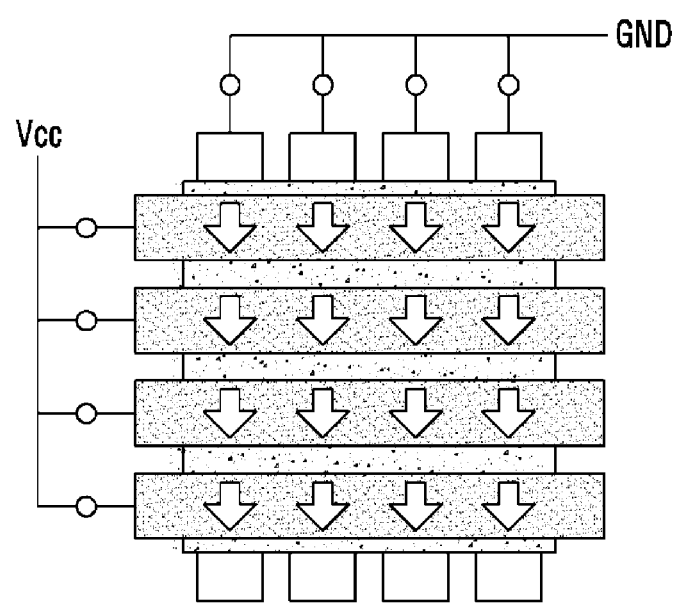

[Figure 12e]
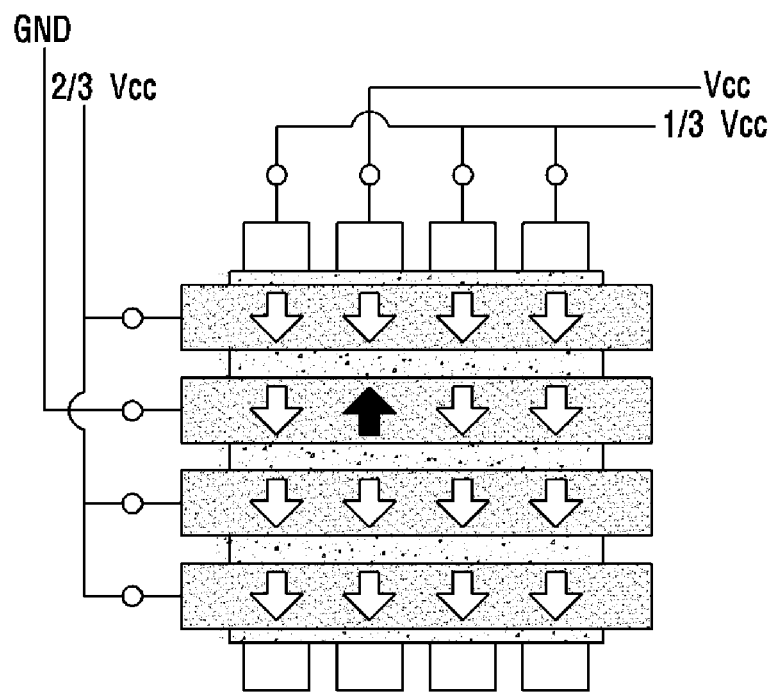
[Figure 12f]
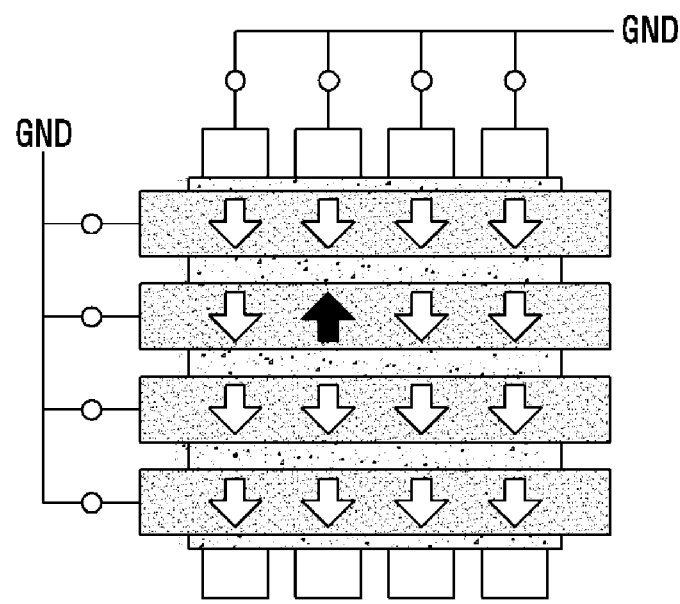

[Figure 13a]
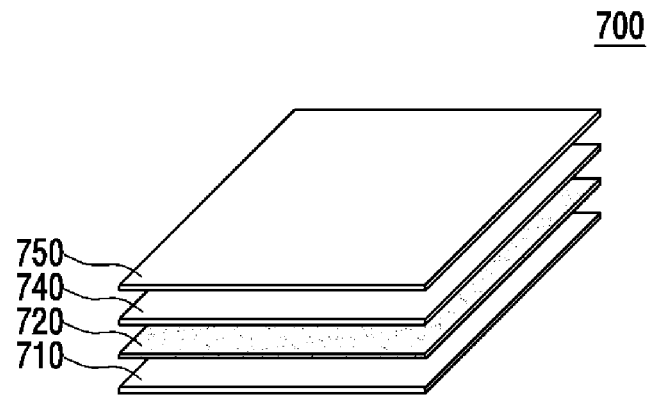
[Figure 13b]
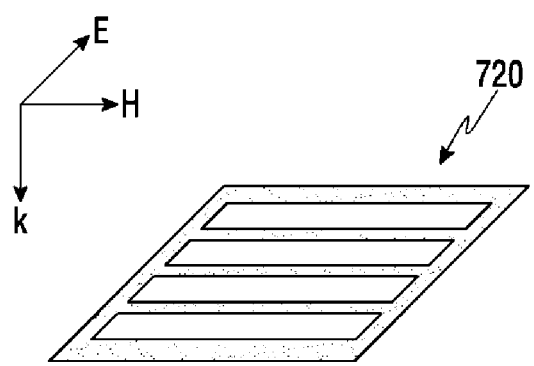
[Figure 13c]
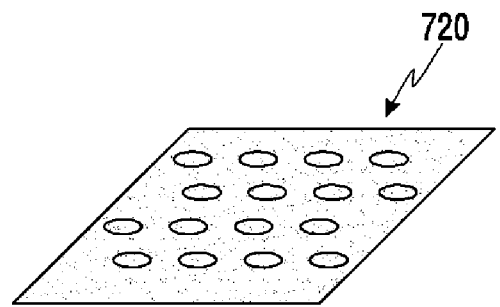

[Figure 14a]
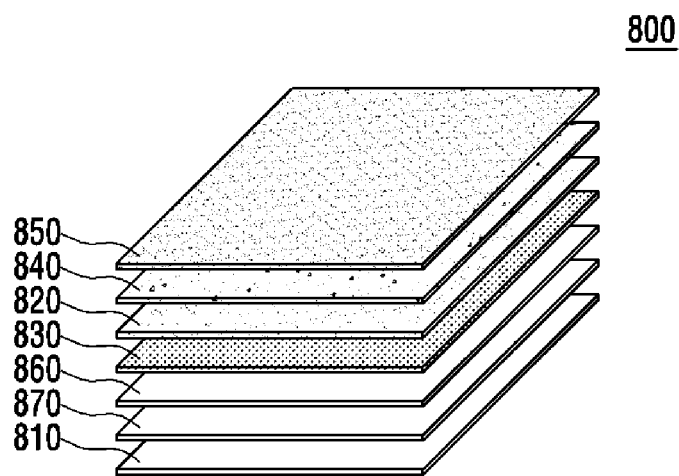
[Figure 14b]
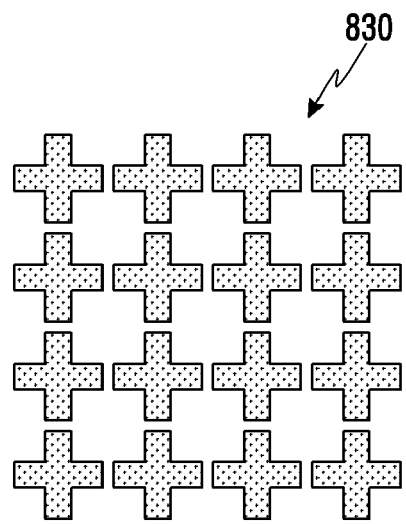

MEMORY DEVICE

CROSS-REFERENCE TO RELATED APPLICATIONS

This application is a national stage entry of International Appl. No. PCT/KR2016/014591, filed Dec. 13, 2016; which claims priority to Korean Appl. No. 10-2016-0033595, filed Mar. 21, 2016; the disclosures of both of which are incorporated by reference herein in their entirety.

TECHNICAL FIELD

The present disclosure relates to a memory device and more particularly to a memory device capable of continuously maintaining modulated optical characteristics.

BACKGROUND ART

A metamaterial means a material composed of meta-atoms, i.e., an artificial structure smaller than the wavelength of light, in order to obtain characteristics which do not exist in nature. This metamaterial has only a single optical characteristic for the constituent material and structure thereof. Recently, much research is being devoted to an active metamaterial in which the optical characteristics of the metamaterial are modulated in response to mechanical, electric/electronic, optical or thermal external stimuli.

There is no need to design or manufacture all the necessary metamaterials because desired optical characteristics of the active metamaterial can be implemented by applying external stimuli. Therefore, the active metamaterial is very advantageous in cost. Also, the optical characteristics of the active metamaterial can be modulated in real time, the active metamaterial is used in optical communication.

However, in the active metamaterial, the external stimuli must be continuously supplied in order to continuously maintain the modulated state. This means that unnecessary power must be supplied. Also, since desired performance can be expected only when a power supply equipment is always present together, it is inevitable that the volume or weight of an apparatus including the active metamaterial is very increased. Therefore, for the purpose of overcoming such problems that power must be continuously supplied and the volume or weight of the apparatus is increased, a concept of a memory metamaterial has been proposed.

The memory metamaterial means a metamaterial of which the optical characteristics are modulated by transient stimuli and the modulated optical characteristics are maintained even though the applied external stimuli are removed.

The memory metamaterial reported so far includes a metamaterial based on vanadium oxide ($VO_2$) that is modulated by thermal stimuli, germanium-antimony-tellurium (GeSbTe, GST) that induces a phase change by strong optical stimuli.

The metamaterial based on vanadium oxide is manufactured in the form of combining vanadium oxide and meta-atoms. After the temperature of the vanadium oxide is increased to about 60° C., i.e., a phase transition temperature by flowing direct current through the vanadium oxide, the conductivity among the meta-atoms is changed, and finally the optical characteristics are modulated. However, the modulated optical characteristics return to their origin at room temperature because the phase transition temperature of the vanadium oxide is maintained at about 60° C. A memory function is maintained only in an apparatus thermally isolated from the outside, the metamaterial based on vanadium oxide is difficult to use at room temperature and is difficult to be commercialized.

Regarding the metamaterial based on GST, a strong optical pulse is applied so as to induce the phase transition of GST. Here, a huge optical device is required. Also, since the temperature is increased during the repetitive operation several times, various problems that oxygen reacts at high temperature or thin films are exfoliated by thermal stresses are caused.

Therefore, there is a demand for the development of the memory device which can be practical and commercial in terms of devices, has very low degradation characteristics, and has modulated characteristics that are maintainable at room temperature for a long time.

DISCLOSURE

Technical Problem

The object of the present invention is to provide a memory device which maintains memory characteristics at room temperature. Furthermore, the object of the present invention is to provide a memory device which can be electrically driven and can continuously maintain modulated optical characteristics.

Technical Solution

One embodiment is a memory device that includes: a substrate; a coupling layer which is located on the substrate and has electrical conductivity; a meta-atomic layer which is located on or under the coupling layer; a memory layer which is located on the meta-atomic layer; and an electrode layer which is located on the memory layer and has electrical conductivity. The memory layer is composed of a material which produces spontaneous polarization at a voltage equal to or higher than a predetermined voltage.

The memory layer may be a ferroelectric or an electret.

The coupling layer may be composed of at least one of an inorganic semiconductor, an organic semiconductor, a metal nanowire, a carbon nanotube, a carbon nanotube derivative, graphene, a graphene derivative, fullerene, a conductive polymer, and a conductive oxide.

The electrode layer may be composed of at least one of an inorganic semiconductor, an organic semiconductor, a metal nanowire, a carbon nanotube, a carbon nanotube derivative, graphene, a graphene derivative, fullerene, a conductive polymer, and a conductive oxide.

The memory device may further include a high dielectric layer provided between the meta-atomic layer and the memory layer.

A dielectric constant of the high dielectric layer may be greater than a dielectric constant of the memory layer.

The high dielectric layer may include at least one of aluminum oxide (AlOx), hafnium oxide (HfOx), zirconium oxide (ZrOx), silicon oxynitride (SiON), silicon nitride (SiNx), barium strontium titanium oxide ($BaSrTiO_3$), barium titanium oxide ($BaTiO_3$) and a graphene nano-flake-containing polymeric material.

The memory device may further include an ionic gel layer provided between the memory layer and the electrode layer.

The ionic gel layer may be provided in an entire surface area of the memory layer, and the electrode layer may be provided in some areas of a surface of the ionic gel layer.

Another embodiment is a memory device that includes: a substrate; a coupling layer which is located on the substrate and has electrical conductivity; a meta-molecular layer which is located on or under the coupling layer; a memory layer which is located on or under the meta-molecular layer; and an electrode layer which is located on the memory layer and has electrical conductivity. The meta-molecular layer is composed of a first meta-atom, a second meta-atom, and a dielectric provided between the first meta-atom and the second meta-atom.

Further another embodiment is a memory device that includes: a substrate; a first electrode layer which is located on the substrate; a first memory layer which is located on the first electrode layer; a meta-atomic layer which is located on the first memory layer; a coupling layer which is located on the meta-atomic layer and has electrical conductivity; a second memory layer which is located on the coupling layer; and a second electrode layer which is located on the second memory layer.

The first electrode layer may include a plurality of parallel first electrode wires. The second electrode layer may include a plurality of parallel second electrode wires. The first electrode wires and the second electrode wires may be arranged in parallel with each other.

Yet embodiment is a memory device that includes: a coupling layer which has electrical conductivity and is patterned to have a plurality of parallel electrode wires; a meta-atomic layer which is located on the coupling layer; and an electrode layer which is located on the meta-atomic layer and is composed of a plurality of parallel electrode wires. The plurality of electrode wires of the coupling layer and the plurality of electrode wires of the electrode layer are orthogonal to each other.

A plurality of quadrangular holes spaced at a predetermined distance are formed in parallel on a single integral sheet, so that the coupling layer may be patterned so as to have a parallel line structure.

The coupling layer may be patterned such that circular pores having a predetermined size are regularly formed on a single integral sheet.

Still another embodiment is a memory device that includes: a substrate; a reflective layer which is located on the substrate; a dielectric which is located on the reflective layer; a meta-atomic layer which is located on the dielectric; a coupling layer which is located on the meta-atomic layer and has electrical conductivity; a memory layer which is located on the coupling layer; and an electrode layer which is located on the memory layer. A degree of light absorption varies depending on at least one of a spaced distance between the reflective layer and the coupling layer and an electrical conductivity of the coupling layer.

The reflective layer may be composed of at least one of an inorganic semiconductor, an organic semiconductor, a metal nanowire, a carbon nanotube, a carbon nanotube derivative, a graphene, a graphene derivative, a fullerene, a conductive polymer, and a conductive oxide.

Advantageous Effects

The memory device having the above configuration according to the embodiment of the present invention can be electrically driven and can continuously maintain modulated optical characteristics. Also, the memory device according to the embodiment of the present invention can modulate optical characteristics by multiple electrical inputs and can implement a spatial light modulator having the memory function.

DESCRIPTION OF DRAWINGS

FIG. 1 is a graph for describing an information memory principle of a memory device according to an embodiment of the present invention;

FIGS. 2a to 2d are views showing the structure of the memory device according to a first embodiment of the present invention;

FIGS. 3a to 3e are graphs showing the characteristics of the memory device according to the first embodiment of the present invention;

FIGS. 4a and 4b are graphs showing the characteristics of the memory device according to the first embodiment of the present invention;

FIG. 5 is a view showing the structure of the memory device according to a second embodiment of the present invention;

FIG. 6 is a view showing the structure of the memory device according to a third embodiment of the present invention;

FIGS. 7a and 7d are views showing the structure of the memory device according to a fourth embodiment of the present invention;

FIGS. 8a and 8d are graphs showing the characteristics of the memory device according to the fourth embodiment of the present invention;

FIGS. 9a to 9d are views showing the structure and operation of the memory device according to a fifth embodiment of the present invention;

FIGS. 10a and 10b are views showing the structure and characteristics of the memory device according to the fifth embodiment of the present invention;

FIGS. 11a to 11e are views showing the structure and operation of the memory device according to a sixth embodiment of the present invention;

FIGS. 12a to 12f are views for describing the operation principle of the memory device according to the six embodiment of the present invention;

FIGS. 13a to 13c are views showing the structure of the memory device according to a seventh embodiment of the present invention; and FIGS. 14a and 14b are views showing the structure of the memory device according to an eighth embodiment of the present invention.

MODE FOR INVENTION

Specific embodiments of the present invention will be described in detail with reference to the accompanying drawings. The specific embodiments shown in the accompanying drawings will be described in enough detail that those skilled in the art are able to embody the present invention. Other embodiments other than the specific embodiments are mutually different, but do not have to be mutually exclusive. Additionally, it should be understood that the following detailed description is not intended to be limited.

The detailed descriptions of the specific embodiments shown in the accompanying drawings are intended to be read in connection with the accompanying drawings, which are to be considered part of the entire written description. Any reference to direction or orientation is merely intended for convenience of description and is not intended in any way to limit the scope of the present invention.

Specifically, relative terms such as "lower," "upper," "horizontal," "vertical," "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description only and do not require that the apparatus be constructed or operated in a particular orientation.

A thickness or size of each component shown in the accompanying drawings is magnified, omitted or schematically shown for the purpose of convenience and clearness of description. That is, the size of each component does not necessarily mean its actual size.

FIG. 1 is a graph for describing an information memory principle of a memory device 100 according to an embodiment of the present invention. Specifically, FIG. 1 is a graph showing a hysteresis loop of electrical polarization of a ferroelectric and an electret with respect to an applied external voltage. The ferroelectric and electret are materials that include a permanent dipole. The ferroelectric and electret are arranged with respect to an external voltage greater than a coercive voltage Vc and produce spontaneous polarization, and maintain their arrangement as it is even when the external voltage is removed.

Depending on the arrangement, the surface of a material including the ferroelectric or electret may have a positive electric charge or a negative electric charge in accordance with the polarity of the externally applied voltage.

In the hysteresis loop of FIG. 1, the y-axis represents a polarization axis and the x-axis represents a voltage axis. As shown in FIG. 1, a positive remanent polarization ($+P_R$) and a negative remanent polarization ($-P_R$), which are two intercepts on the polarization axis of the hysteresis loop, represent a state where the ferroelectric or electret has a positive electric charge or a negative electric charge in accordance with the polarity (+Vc or −Vc) of the externally applied voltage.

The memory device 100 according to the embodiment of the present invention may have various embodiments having a variety of layer structures and configurations by using the charge of the surface, which changes depending on the polarity of the voltage.

First Embodiment

FIGS. 2a to 2d are views showing the structure of the memory device 100 according to a first embodiment of the present invention.

As shown in FIG. 2a, the memory device 100 according to the first embodiment of the present invention includes a substrate 110, a coupling layer 120 located on the substrate 110, a meta-atomic layer 130 located on the coupling layer 120, a memory layer 140 located on the meta-atomic layer 130, and an electrode layer 150 located on the memory layer 140. Although FIG. 2a shows that the meta-atomic layer 130 is located on the coupling layer 120, the coupling layer 120 may be located on the meta-atomic layer 130 in other embodiments. Here, for convenience of description and understanding, it is assumed that a side where the substrate 110 is located is a lower side and a side where the electrode layer 150 is located is an upper side.

The substrate 110 may be made of polyimide, however, is not limited thereto.

The coupling layer 120 may be composed of at least one of an inorganic semiconductor, an organic semiconductor, a metal nanowire, a carbon nanotube, a carbon nanotube derivative, graphene, a graphene derivative, fullerene, a conductive polymer, and a conductive oxide, however, is not limited thereto. It is preferable that the coupling layer 120 has conductivity so as to serve as an electrode.

The meta-atomic layer 130 may include, as shown in FIG. 2c, a meta-atom composed of a hexagonal array, and however, the arrangement and structure thereof are not limited thereto.

The memory layer 140 may include the ferroelectric or the electret. As described above, the ferroelectric or the electret is a material that includes a permanent dipole. The ferroelectric or the electret is arranged with respect to an external voltage greater than a coercive voltage and produces spontaneous polarization, and maintains its arrangement as it is even when the external voltage is removed. Therefore, the ferroelectric or the electret can be used to form the memory layer 140.

The electrode layer 150 may be formed of the same material as that of the coupling layer 120. That is, the electrode layer 150 may be composed of at least one of an inorganic semiconductor, an organic semiconductor, a metal nanowire, a carbon nanotube, a carbon nanotube derivative, a graphene, a graphene derivative, a fullerene, a conductive polymer, and a conductive oxide. However, the embodiment of the present invention is not limited to the particular material of the electrode layer 150.

Meanwhile, the electrode layer 150 may be composed of a single sheet having a flat plate shape as shown in FIG. 2a, or may be also composed of a patterned metal wire as shown in FIG. 2b. Here, an electric field direction E of an electromagnetic wave which is incident in a k-direction of FIG. 2b is perpendicular to a plurality of metal wires and is parallel to a magnetic field direction H. FIG. 2d shows the memory device 100 to which the patterned electrode layer 150 shown in FIG. 2b is applied.

FIG. 3a shows the structure of the memory device 100 according to the first embodiment of the present invention. FIGS. 3b to 3e are graphs showing the characteristics of the memory device 100 according to the first embodiment of the present invention shown in FIG. 3a. The graphs of FIGS. 3b to 3e show the characteristics of the memory device 100 (structure of FIG. 3a) manufactured by a process in which the substrate 110 is made of polyimide, the coupling layer 120 is made of graphene, the meta-atomic layer 130 is made of meta-atoms made of gold (Au) composed of a hexagonal array, the memory layer 140 is made of ferroelectric polymer (poly(vinylidene fluoride-trifluoroethylene); P(VDF-TrFE)), and the electrode layer 150 is made by a metal wire array.

FIG. 3b shows a transmittance when different voltages (+200V, −120V, −200V) are applied. In the graph of FIG. 3b, the x-axis represents a frequency and the y-axis represents a transmittance intensity. As shown in FIG. 3b, different transmittance characteristics are shown depending on the polarity of an externally applied voltage (a voltage applied between the coupling layer 120 and the electrode layer 150). As a result of measuring the transmittance intensity at a specific frequency while repeatedly varying the strength of the voltage, it can be seen that the transmittance intensity is modulated to a multi-state as shown in FIGS. 3c and 3d.

Referring to FIG. 3e, the measurement time is 100,000 seconds, and the transmittance intensities modulated in the measurement interval do not overlap with each other. By extrapolating this, it can be said that the memory function can be maintained because the values modulated for about ten years can be distinguished.

Meanwhile, FIGS. 4a and 4b show a phase difference according to time and voltage. In the case of the meta-atomic layer 130 using hexagonal meta-atoms, a specific phase difference is maintained according to the voltage, and the phase difference is maintained as it is even though a period of time elapses (measurement for 100,000 seconds). Accordingly, it can be found that the memory device 100 has the multi-state modulation and the memory function.

Second Embodiment

FIG. 5 shows the structure of a memory device 200 according to a second embodiment of the present invention. As shown in FIG. 5, the memory device 200 according to the second embodiment of the present invention includes a substrate 210, a coupling layer 220 located on the substrate 210, a meta-atomic layer 230 located on the coupling layer 220, a high dielectric layer 235 located on the meta-atomic layer 230, a memory layer 240 located on the high dielectric layer 235, and an electrode layer 250 located on the memory layer 240. Although FIG. 5 shows that the meta-atomic layer 230 is located on the coupling layer 220, the coupling layer 220 may be located on the meta-atomic layer 230 in other embodiments. Similarly, for convenience of description and understanding, it is assumed that a side where the substrate 210 is located is a lower side and a side where the electrode layer 250 is located is an upper side.

The substrate 210 may be made of polyimide, however, is not limited thereto.

The coupling layer 220 may be made of at least one of an inorganic semiconductor, an organic semiconductor, a metal nanowire, a carbon nanotube, a carbon nanotube derivative, graphene, a graphene derivative, fullerene, a conductive polymer, and a conductive oxide, however, is not limited thereto. It is preferable that the coupling layer 220 has conductivity so as to serve as an electrode.

The meta-atomic layer 230 may include a meta-atom composed of a hexagonal array, and however, the second embodiment is not limited to the arrangement and structure of the meta-atom included in the meta-atomic layer 230 either.

The memory layer 240 may include the ferroelectric or the electret. As described above, the ferroelectric or the electret is a material that includes a permanent dipole. The ferroelectric or the electret is arranged with respect to an external voltage greater than a coercive voltage and produces spontaneous polarization, and maintains its arrangement as it is even when the external voltage is removed. Therefore, the ferroelectric or the electret can be used to form the memory layer 240.

The electrode layer 250 may be formed of the same material as that of the coupling layer 220. That is, the electrode layer 250 may be composed of at least one of an inorganic semiconductor, an organic semiconductor, a metal nanowire, a carbon nanotube, a carbon nanotube derivative, a graphene, a graphene derivative, a fullerene, a conductive polymer, and a conductive oxide. However, the embodiment of the present invention is not limited to the particular material of the electrode layer 250. Meanwhile, the electrode layer 250 may be composed of a single sheet having a flat plate shape or may be also composed of a patterned metal wire.

The memory device 200 according to the second embodiment includes the high dielectric layer 235 between the meta-atomic layer 230 and the memory layer 240.

The high dielectric layer 235 is made of a material having a greater dielectric constant than that of the memory layer 240. By the high dielectric layer 235 having a greater dielectric constant than that of the memory layer 240, the technical effect of reducing the operating voltage of the memory device 200 according to the second embodiment of the present invention can be achieved.

The high dielectric layer 235 may include at least one of aluminum oxide (AlOx), hafnium oxide (HfOx), zirconium oxide (ZrOx), silicon oxynitride (SiON), silicon nitride (SiNx), barium strontium titanium oxide ($BaSrTiO_3$), barium titanium oxide ($BaTiO_3$) and a graphene nano-flake-containing polymeric material.

Third Embodiment

FIG. 6 shows the structure of the memory device according to a third embodiment of the present invention. As shown in FIG. 6, the memory device 300 according to the third embodiment of the present invention includes a substrate 310, a coupling layer 320 located on the substrate 310, a meta-atomic layer 330 located on the coupling layer 320, a memory layer 340 located on the meta-atomic layer 330, an ionic gel layer 345 located on the memory layer 340, and an electrode layer 350 located on the ionic gel layer 345. Although FIG. 6 shows that the meta-atomic layer 130 is located on the coupling layer 320, the coupling layer 320 may be located on the meta-atomic layer 330 in other embodiments. Similarly, for convenience of description and understanding, it is assumed that a side where the substrate 310 is located is a lower side and a side where the electrode layer 350 is located is an upper side.

The substrate 310 may be made of polyimide, however, is not limited thereto.

The coupling layer 320 may be made of at least one of an inorganic semiconductor, an organic semiconductor, a metal nanowire, a carbon nanotube, a carbon nanotube derivative, graphene, a graphene derivative, fullerene, a conductive polymer, and a conductive oxide, however, is not limited thereto. It is preferable that the coupling layer 320 has conductivity so as to serve as an electrode.

The meta-atomic layer 330 may include a meta-atom composed of a hexagonal array, and however, is not limited to a specific arrangement or structure of the meta-atom.

The memory layer 340 may include the ferroelectric or the electret. As described above, the ferroelectric or the electret is a material that includes a permanent dipole. The ferroelectric or the electret is arranged with respect to an external voltage greater than a coercive voltage and produces spontaneous polarization, and maintains its arrangement as it is even when the external voltage is removed. Therefore, the ferroelectric or the electret can be used to form the memory layer 340.

The electrode layer 350 may be formed of the same material as that of the coupling layer 320. That is, the electrode layer 350 may be composed of at least one of an inorganic semiconductor, an organic semiconductor, a metal nanowire, a carbon nanotube, a carbon nanotube derivative, a graphene, a graphene derivative, a fullerene, a conductive polymer, and a conductive oxide. However, the embodiment of the present invention is not limited to the particular material of the electrode layer 350. Meanwhile, the electrode layer 350 may be composed of a single sheet having a flat plate shape, or may be also composed of a patterned metal wire.

The memory device 300 according to the third embodiment includes the ionic gel layer 345 between the memory layer 340 and the electrode layer 350. The ionic gel layer 345 is made of an electrical dielectric material. The technical effect of easily manufacturing the structure of the memory meta-material and of reducing the operating voltage of the memory device 300 is achieved.

In particular, since the ionic gel layer 345 is made of an electrical dielectric material, the electrode layer 350 does not necessarily need to be located in the entire area on the memory layer 340 as shown in FIG. 6. In other words, although the ionic gel layer 345 is provided in the entire surface area of the memory layer 340, the electrode layer 350 can be provided in some areas of the ionic gel layer 345. The ionic gel layer 345 obtains the technical effect of facilitating fabrication of the memory device 300 and voltage application.

Fourth Embodiment

FIGS. 7a and 7d are views showing the structure of the memory device 400 according to a fourth embodiment of the present invention. As shown in FIG. 7a, the memory device 400 according to the fourth embodiment of the present invention includes a substrate 410, a meta-molecular layer 415 located on the substrate 410, a coupling layer 420 located on the meta-molecular layer 415, a memory layer 440 located on the coupling layer 420, and an electrode layer 450 located on the memory layer 440. Although FIG. 7a shows that the coupling layer 420 is located on the meta-molecular layer 415, the meta-molecular layer 415 may be located on the coupling layer 420 in other embodiments. Similarly, for convenience of description and understanding, it is assumed that a side where the substrate 410 is located is a lower side and a side where the electrode layer 450 is located is an upper side.

The substrate 410 may be made of polyimide, however, is not limited thereto.

The coupling layer 420 may be made of at least one of an inorganic semiconductor, an organic semiconductor, a metal nanowire, a carbon nanotube, a carbon nanotube derivative, graphene, a graphene derivative, fullerene, a conductive polymer, and a conductive oxide, however, is not limited thereto. It is preferable that the coupling layer 420 has conductivity so as to serve as an electrode.

The memory layer 440 may include the ferroelectric or the electret. As described above, the ferroelectric or the electret is a material that includes a permanent dipole. The ferroelectric or the electret is arranged with respect to an external voltage greater than a coercive voltage and produces spontaneous polarization, and maintains its arrangement as it is even when the external voltage is removed. Therefore, the ferroelectric or the electret can be used to form the memory layer 440.

The electrode layer 450 may be formed of the same material as that of the coupling layer 420. That is, the electrode layer 450 may be composed of at least one of an inorganic semiconductor, an organic semiconductor, a metal nanowire, a carbon nanotube, a carbon nanotube derivative, a graphene, a graphene derivative, a fullerene, a conductive polymer, and a conductive oxide. However, the embodiment of the present invention is not limited to the particular material of the electrode layer 450. Meanwhile, the electrode layer 450 may be composed of a single sheet having a flat plate shape, or may be also composed of a patterned metal wire.

As shown in FIGS. 7b and 7c, the meta-molecular layer 415 includes a first meta-atom 415-1, a second meta-atom 415-3, and a dielectric 415-2 provided between the first meta-atom 415-1 and the second meta-atom 415-3. In the meta-molecular layer 415, two or more of the structures affect each other to show optical characteristics.

More specifically, the meta-molecular layer 415 is a metamaterial that changes the incident polarization state and transmits it. When the linearly polarized light is transmitted, and the oscillation axis of the electric field and the magnetic field rotates with respect to the incident light. A photomicrograph of an actually manufactured sample of the meta-molecular layer 415 is shown in FIG. 7d.

Meanwhile, FIG. 8a shows the structure of the memory device 400 according to the fourth embodiment of the present invention. FIGS. 8a and 8d are graphs showing the characteristics of the memory device 400 according to the fourth embodiment of the present invention. Here, the graphs of FIGS. 8b to 8d show the characteristics of the memory device 400 (structure of FIG. 8a) manufactured by a process in which the substrate 410 is made of polyimide, the meta-molecular layer 415 is composed of the dielectric 415-2 and the two gold-made meta-atoms 415-1 and 415-3 which are overlapped with each other such that the "Z"-shapes are, as shown in FIG. 7c, orthogonal to each other, the coupling layer 420 is made of graphene, the memory layer 440 is made of ferroelectric polymer (poly(vinylidene fluoride-trifluoroethylene); P(VDF-TrFE)), and the electrode layer 450 is made by a metal wire array.

FIGS. 8b to 8d show that the polarization state is modulated to a multi-state and memory characteristics. The measurement time is 100,000 seconds, and the transmittance intensities modulated in the measurement interval do not overlap with each other. By extrapolating this, it can be said that the memory function can be maintained because the values modulated for about ten years can be distinguished.

In addition, regarding the phase difference according to time and voltage, since a specific phase difference is continuously maintained even though a period of time elapses, it can be found that the memory device 400 has the multi-state modulation and the memory function.

Fifth Embodiment

FIGS. 9a to 9b are views showing the structure the memory device 500 according to a fifth embodiment of the present invention.

As shown in FIG. 9a, the memory device 500 according to the fifth embodiment of the present invention includes a substrate 510, a first electrode layer 550-1 located on the substrate 510, a first memory layer 540-1 located on the first electrode layer 550-1, a meta-atomic layer 530 located on the first memory layer 540-1, a coupling layer 520 located on the meta-atomic layer 530, a second memory layer 540-2 located on the coupling layer 520, and a second electrode layer 550-2 located on the second memory layer 540-2. Although FIG. 9a shows that the coupling layer 520 is located on the meta-atomic layer 530, the meta-atomic layer 530 may be located on the coupling layer 520 in other embodiments. Similarly, for convenience of description and understanding, it is assumed that a side where the substrate 510 is located is a lower side and a side where the second electrode layer 550-2 is located is an upper side.

The substrate 510 may be made of polyimide, however, is not limited thereto.

The coupling layer 520 may be made of at least one of an inorganic semiconductor, an organic semiconductor, a metal nanowire, a carbon nanotube, a carbon nanotube derivative, graphene, a graphene derivative, fullerene, a conductive polymer, and a conductive oxide, however, is not limited thereto.

The first memory layer 540-1 and the second memory layer 540-2 may include the ferroelectric or the electret. As described above, the ferroelectric or the electret is a material that includes a permanent dipole. The ferroelectric or the electret is arranged with respect to an external voltage greater than a coercive voltage and produces spontaneous polarization, and maintains its arrangement as it is even when the external voltage is removed.

The first electrode layer 550-1 and the second electrode layer 550-2 may be formed of the same material as that of the coupling layer 520. That is, the first electrode layer 550-1 and the second electrode layer 550-2 may be composed of at least one of an inorganic semiconductor, an organic semiconductor, a metal nanowire, a carbon nanotube, a carbon nanotube derivative, a graphene, a graphene derivative, a fullerene, a conductive polymer, and a conductive oxide. However, the embodiment of the present invention is not limited to the particular material of the first electrode layer 550-1 or the second electrode layer 550-2.

The first electrode layer 550-1 and the second electrode layer 550-2 may be, as shown in FIG. 9a, composed of a single sheet having a flat plate shape. However, as shown in FIG. 9b, it may be also composed of a patterned metal wire. When the first electrode layer 550-1 and the second electrode layer 550-2 are implemented by the patterned metal wire, they can function as two or more bit memory by using various polarization combinations.

As shown in FIG. 9b, when the first electrode layer 550-1 and the second electrode layer 550-2 are provided with patterned metal wires, a plurality of metal wires provided in the first electrode layer 550-1 are arranged in parallel with each other. In addition, a plurality of metal wires provided in the second electrode layer 550-2 are also arranged in parallel with each other. Furthermore, the metal wires provided in the first electrode layer 550-1 and the metal wires provided in the second electrode layer 550-2 are arranged in parallel with each other.

In FIG. 9b, an electric field direction E of light incident in a k-direction is perpendicular to the metal wires of the first electrode layer 550-1 and the metal wires of the second electrode layer 550-2, and a magnetic field direction H of the incident light is in parallel with the metal wires of the first electrode layer 550-1 and the metal wires of the second electrode layer 550-2.

If the remnant polarization provided from the first memory layer 540-1 and the second memory layer 540-2 to the coupling layer is the same, various polarization combinations can be made according to the polarization directions of the first memory layer 540-1 and the second memory layer 540-2.

FIG. 9c shows the polarization combination according to the polarization directions of the first memory layer 540-1 and the second memory layer 540-2 in the memory device 500 according to the fifth embodiment. Here, the polarization combination may be interpreted as four logic inputs.

When a hollow arrow indicating a negative polarization is defined as a logic state "0", and a filled arrow indicating a positive polarization is defined as a logic state "1", a logic combination (0,0), (0,1), (1,0), and (1,1) can be represented.

Since the sum of the polarization provided to the coupling layer 520 is 0, 1, 2, and 3, the transmittance graph is as shown in FIG. 9d. Here, if a detector (not shown) interprets a comparison level 1 (indicated by "comparison 1" in FIG. 9d) as a reference, a value greater than the comparison level 1 can be detected only in the case of (1, 1). Therefore, the memory device 500 according to the fifth embodiment of the present invention can operate as an AND gate.

Additionally, if the detector (not shown) interprets a comparison level 2 (indicated by "comparison 2" in FIG. 9d) as a reference, a value greater than the comparison level 2 can be detected in the case of (0, 1), (1, 0), and (1, 1).

Therefore, the memory device 500 according to the fifth embodiment of the present invention can operate as an OR gate.

FIG. 10a is a view showing the structure of the memory device 500 according to the fifth embodiment of the present invention. FIG. 10b is a graph showing the transmittance intensity according to frequency. The memory device 500 is manufactured by a process in which the substrate 510 is made of polyimide, the coupling layer 520 is made of graphene, the meta-atomic layer 530 is made of meta-atoms made of gold (Au) composed of a hexagonal array, the memory layer 540 is made of ferroelectric polymer (poly (vinylidene fluoride-trifluoroethylene); P(VDF-TrFE)), and the electrode layer 550 is made by a metal wire array. The fifth embodiment of the present invention uses the memory device 500 as a sample.

Since the modulated transmittance intensities do not overlap with each other in the memory device 500 according to the fifth embodiment of the present invention, it can be found that the memory device 500 has the multi-state modulation and the memory function.

Sixth Embodiment

FIG. 11a shows the structure the memory device 600 according to a sixth embodiment of the present invention.

As shown in FIG. 11a, the memory device 600 according to the sixth embodiment of the present invention includes a substrate 610, a coupling layer 620 located on the substrate 110, a meta-atomic layer 630 located on the coupling layer 620, a memory layer 640 located on the meta-atomic layer 630, and an electrode layer 650 located on the memory layer 640. Although FIG. 11a shows that the meta-atomic layer 630 is located on the coupling layer 620, the coupling layer 620 may be located on the meta-atomic layer 630 in other embodiments. For convenience of description and understanding, it is assumed that a side where the substrate 610 is located is a lower side and a side where the electrode layer 650 is located is an upper side.

The substrate 610 may be made of polyimide, however, is not limited thereto.

The coupling layer 620 may be made of at least one of an inorganic semiconductor, an organic semiconductor, a metal nanowire, a carbon nanotube, a carbon nanotube derivative, graphene, a graphene derivative, fullerene, a conductive polymer, and a conductive oxide, however, is not limited thereto.

The memory layer 640 may include the ferroelectric or the electret. As described above, the ferroelectric or the electret is a material that includes a permanent dipole. The ferroelectric or the electret is arranged with respect to an external voltage greater than a coercive voltage and produces spontaneous polarization, and maintains its arrangement as it is even when the external voltage is removed.

The electrode layer 650 may be formed of the same material as that of the coupling layer 620. That is, the electrode layer 650 may be composed of at least one of an inorganic semiconductor, an organic semiconductor, a metal nanowire, a carbon nanotube, a carbon nanotube derivative, a graphene, a graphene derivative, a fullerene, a conductive polymer, and a conductive oxide. However, the embodiment of the present invention is not limited to the particular material of the electrode layer 650.

As shown in FIG. 11a, the electrode layer 650 may include a plurality of parallel metal wires. The coupling layer 620 may also include a plurality of parallel metal wires. However, it is preferable that the plurality of parallel metal wires constituting the coupling layer 620 and the plurality of parallel metal wires constituting the electrode layer 650 are arranged to be orthogonal to each other. However, in other embodiments, they may be arranged in such a manner that they are not completely orthogonal but intersect each other at a predetermined angle.

Referring to FIG. 11*b*, a positive voltage having the same magnitude is applied to all the metal wires of the electrode layer 650, and a negative voltage is applied to all the patterned metal wires of the coupling layer 620. Then, polarization having the same size and the same direction is induced at the intersection point of the metal wires of the electrode layer 650 and the metal wires of the coupling layer 620.

In FIG. 11*c*, the polarized state is indicated by a hollow arrow directed downward, and the magnitude thereof is assumed to be +5. Here, the optical characteristics may be spatially changed by storing the opposite direction polarization only at specific intersections. This is shown as an intersection point indicated by a hollow arrow directed upward in FIGS. 11*d* and 11*e*. It can be seen that the magnitude of the polarization is changed to −5. This can be usefully used as a nonvolatile spatial light modulator (N-SLM). This will be described in more detail.

FIGS. 12*a* to 12*f* are views for describing the operation principle of the memory device 600 according to the six embodiment of the present invention.

The electrode layer 650 is, as shown in FIGS. 12*a* and 12*c*, composed of four metal wires X1, X2, X3 and X4, and the coupling layer 620 is also composed of four sheets of graphene Y1, Y2, Y3 and Y4. The metal wires are arranged to be orthogonal to each other, forming a total of 16 intersections. The meta-atomic layer 630 may have, as shown in FIG. 12*b*, a hexagonal arrangement, however, is not limited thereto.

Here, the four sheets of graphene Y1, Y2, Y3 and Y4 of the coupling layer 620 are connected to the ground GND, and a voltage Vcc having a magnitude greater than that of the coercive voltage Vc is applied to the four metal wires X1, X2, X3, and X4 of the electrode layer 650 respectively, an initial state is established. (FIG. 12*d*).

The polarization of each intersection can be changed by controlling only the magnitude of the voltage applied to the four metal wires X1, X2, X3 and X4 of the electrode layer 650 and the magnitude of the voltage applied to the four sheets of graphene Y1, Y2, Y3 and Y4 of the coupling layer 620. For example, when X1, X3 and X4 are connected to ⅔ Vcc and Y1, Y3 and Y4 are connected to ⅓ Vcc while X2 is connected to the ground and Y2 is connected to Vcc, a voltage having a magnitude of Vcc is applied to the intersection (2, 2) and only ⅓ Vcc is applied to the remaining 15 intersection points. If ⅓ Vcc is set to a value smaller than that of the coercive voltage Vc shown in FIG. 1, the polarizations of the 15 intersection points are not changed (see FIG. 12*e*). Therefore, when the four metal wires X1, X2, X3, and X4 and the four sheets of graphene Y1, Y2, Y3, and Y4 are connected to the ground after applying the voltage, only the intersection (X2, Y2) is maintained in a polarization inversion state (see FIG. 12*f*). In FIGS. 12*a* to 12*f*, it is assumed that there are 16 intersections for convenience of description and understanding. However, a nonvolatile spatial light modulator having a random resolution can be manufactured by increasing the number of the metal wires of the electrode layer 650 and the number of graphene patterns of the coupling layer 620.

Seventh Embodiment

FIG. 13*a* shows the structure of the memory device 700 according to a seventh embodiment of the present invention.

As shown in FIG. 13*a*, the memory device 700 according to the seventh embodiment of the present invention includes a substrate 710, a coupling layer 720 located on the substrate 710, a memory layer 740 located on the coupling layer 720, and an electrode layer 750 located on the memory layer 740. For convenience of description and understanding, it is assumed that a side where the substrate 710 is located is a lower side and a side where the electrode layer 750 is located is an upper side.

The substrate 710 may be made of polyimide, however, is not limited thereto.

The memory layer 740 may include the ferroelectric or the electret. As described above, the ferroelectric or the electret is a material that includes a permanent dipole. The ferroelectric or the electret is arranged with respect to an external voltage greater than a coercive voltage and produces spontaneous polarization, and maintains its arrangement as it is even when the external voltage is removed. Therefore, the ferroelectric or the electret can be used to form the memory layer 740.

The electrode layer 750 may be composed of at least one of an inorganic semiconductor, an organic semiconductor, a metal nanowire, a carbon nanotube, a carbon nanotube derivative, graphene, a graphene derivative, fullerene, a conductive polymer, and a conductive oxide. However, the embodiment of the present invention is not limited to the particular material of the electrode layer 750. Meanwhile, the electrode layer 750 may be composed of a single sheet having a flat plate shape or may be also composed of a patterned metal wire.

The coupling layer 720 of the memory device 700 according to the seventh embodiment of the present invention may be patterned as shown in FIGS. 13*b* and 13*c*. In particular, the coupling layer 720 may be formed of patterned graphene, and is not limited to the material of the graphene. The coupling layer 720 may be made of at least one of an inorganic semiconductor, an organic semiconductor, a metal nanowire, a carbon nanotube, a carbon nanotube derivative, a graphene derivative, fullerene, a conductive polymer, and a conductive oxide. It is preferable that the coupling layer 720 has conductivity so as to serve as an electrode.

The coupling layer 720 shown in FIG. 13*b* is graphene having a parallel line structure in which a plurality of parallel quadrangular holes are patterned. In addition, the coupling layer 720 is connected to every graphene for external electrical connection. That is, the plurality of quadrangular holes spaced at a predetermined distance are formed in parallel on a single integral sheet, so that the coupling layer 720 is patterned so as to have a parallel line structure.

The electric field direction E of the light incident in the k-direction is perpendicular to the graphene pattern, and the magnetic field direction (H) of the incident light is horizontal to the graphene pattern. Here, the patterned graphene forms plasmonic, which absorbs light having a specific resonance frequency in accordance with the patterned structure, so that it can be used in an optical sensor, an optical modulator, a solar cell, and the like.

The coupling layer 720 shown in FIG. 13*c* has a shape in which circular holes are regularly patterned. That is, the coupling layer 720 may be patterned such that circular pores having a predetermined size are regularly formed on a single integral sheet. In this case as well, as described above, plasmonic is formed according to the structure and spacing of the patterned circular holes and reacts with the incident light.

Eighth Embodiment

FIG. 14a shows the structure of the memory device 800 according to an eighth embodiment of the present invention.

As shown in FIG. 14a, the memory device 800 according to the eighth embodiment of the present invention includes a substrate 810, a reflective layer 870 located on the substrate 810, a dielectric 860 located on the reflective layer 870, a meta-atomic layer 830 located on the dielectric 860, a coupling layer 820 located on the meta-atomic layer 830, a memory layer 840 located on the coupling layer 820, and an electrode layer 850 located on the memory layer 840. Although FIG. 14a shows that the coupling layer 820 is located on the meta-atomic layer 830, the coupling layer 820 may be located under the meta-atomic layer 830 in other embodiments. Here, for convenience of description and understanding, it is assumed that a side where the substrate 810 is located is a lower side and a side where the electrode layer 850 is located is an upper side.

The substrate 810 may be made of polyimide, however, is not limited thereto.

The coupling layer 820 may be made of at least one of an inorganic semiconductor, an organic semiconductor, a metal nanowire, a carbon nanotube, a carbon nanotube derivative, graphene, a graphene derivative, fullerene, a conductive polymer, and a conductive oxide, however, is not limited thereto. It is preferable that the coupling layer 820 has conductivity so as to serve as an electrode.

The meta-atomic layer 830 may include a meta-atom composed of a hexagonal array, and however, the arrangement and structure thereof are not limited thereto.

The memory layer 840 may include the ferroelectric or the electret. As described above, the ferroelectric or the electret is a material that includes a permanent dipole. The ferroelectric or the electret is arranged with respect to an external voltage greater than a coercive voltage and produces spontaneous polarization, and maintains its arrangement as it is even when the external voltage is removed. Therefore, the ferroelectric or the electret can be used to form the memory layer 840.

The electrode layer 850 may be formed of the same material as that of the coupling layer 820. That is, the electrode layer 850 may be composed of at least one of an inorganic semiconductor, an organic semiconductor, a metal nanowire, a carbon nanotube, a carbon nanotube derivative, a graphene, a graphene derivative, a fullerene, a conductive polymer, and a conductive oxide. However, the embodiment of the present invention is not limited to the particular material of the electrode layer 850. Meanwhile, the electrode layer 850 may be composed of a single sheet having a flat plate shape, or may be also composed of a patterned metal wire.

The reflective layer 870 may be formed of the same material as that of the coupling layer 820. That is, the reflective layer 870 may be composed of at least one of an inorganic semiconductor, an organic semiconductor, a metal nanowire, a carbon nanotube, a carbon nanotube derivative, a graphene, a graphene derivative, a fullerene, a conductive polymer, and a conductive oxide. However, the embodiment of the present invention is not limited to the particular material of the reflective layer 870. Meanwhile, the reflective layer 870 may be composed of a single sheet having a flat plate shape, or may be also composed of a patterned metal wire.

The memory device 800 according to the eighth embodiment of the present invention corresponds to a reflective memory metamaterial. Among various frequencies components constituting the light incident perpendicularly to the electrode layer 850, light corresponding to the frequency component equal to the resonance frequency that the reflective memory metamaterial has is absorbed in reflective memory metamaterial. The degree of the light absorption varies depending on the conductivity state of the coupling layer.

When the degree of the absorption increases, the amount of reflected light is reduced and the reflective memory metamaterial operates as a perfect absorber. When the degree of the absorption decreases, the reflective memory metamaterial operates as a reflector.

The amount and polarity of the polarization provided to the coupling layer 820 from the memory layer 840 are changed according to the voltage applied to the electrode layer 850. Therefore, so that the memory device (800) can operate as the reflective memory metamaterial capable of storing the degree of the absorption and the degree of the reflection.

Meanwhile, FIG. 14b shows the meta-atom shape and arrangement included in the meta-atomic layer 830 according to the eighth embodiment of the present invention. When the meta-atom included in the meta-atomic layer 830 forms a cross shape as shown in FIG. 14b, it is easy to control the degree of the reflection. However, it is obvious to a person having ordinary skill in the art that the meta-atom does not necessarily form a cross shape, and can be embodied in various shapes.

The features, structures and effects and the like described in the embodiments are included in at least one embodiment of the present invention and are not necessarily limited to one embodiment. Furthermore, the features, structures, effects and the like provided in each embodiment can be combined, changed, modified, converted, replaced, added, transformed, and applied by those skilled in the art to which the embodiments belong. Therefore, contents related to the combination, change, modification, conversion, replacement, and addition should be construed to be included in the scope of the present invention without departing from the spirit of the present invention.

REFERENCE NUMERALS

100 . . . memory device
110 . . . substrate
120 . . . coupling layer
130 . . . meta-atomic layer
140 . . . memory layer
150 . . . electrode layer

The invention claimed is:
1. A memory device comprising:
a substrate;
a coupling layer which is located on the substrate and has electrical conductivity;
a meta-atomic layer which is located on or under the coupling layer, the meta-atomic layer including a meta-atom;
a memory layer which is located on the meta-atomic layer;
a high dielectric layer provided between the meta-atomic layer and the memory layer; and
an electrode layer which is located on the memory layer and has electrical conductivity,
wherein the memory layer is composed of a material which produces spontaneous polarization at a voltage equal to or higher than a predetermined voltage.

2. The memory device of claim 1, wherein a dielectric constant of the high dielectric layer is greater than a dielectric constant of the memory layer.

3. The memory device of claim 1, wherein the high dielectric layer comprises at least one of aluminum oxide (AlOx), hafnium oxide (HfOx), zirconium oxide (ZrOx), silicon oxynitride (SiON), silicon nitride (SiNx), barium strontium titanium oxide ($BaSrTiO_3$), barium titanium oxide ($BaTiO_3$) and a graphene nano-flake-containing polymeric material.

4. The memory device of claim 1, further comprising an ionic gel layer provided between the memory layer and the electrode layer.

5. The memory device of claim 4, wherein the ionic gel layer is provided in an entire surface area of the memory layer, and the electrode layer is provided in some areas of a surface of the ionic gel layer.

6. The memory device of claim 1, wherein the memory layer is a ferroelectric or an electret.

7. The memory device of claim 1, wherein the coupling layer is composed of at least one of an inorganic semiconductor, an organic semiconductor, a metal nanowire, a carbon nanotube, a carbon nanotube derivative, graphene, a graphene derivative, fullerene, a conductive polymer, and a conductive oxide.

8. The memory device of claim 1, wherein the electrode layer is composed of at least one of an inorganic semiconductor, an organic semiconductor, a metal nanowire, a carbon nanotube, a carbon nanotube derivative, a graphene, a graphene derivative, a fullerene, a conductive polymer, and a conductive oxide.

* * * * *